United States Patent
Shin

(10) Patent No.: US 10,032,666 B2
(45) Date of Patent: Jul. 24, 2018

(54) SEMICONDUCTOR MEMORY DEVICE AND METHOD OF FABRICATING THE SAME

(71) Applicant: Samsung Electronics Co., Ltd., Samsung-ro, Yeongtong-gu, Suwon-si, Gyeonggi-do (KR)

(72) Inventor: JoongShik Shin, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/250,231

(22) Filed: Aug. 29, 2016

(65) Prior Publication Data

US 2017/0148677 A1 May 25, 2017

(30) Foreign Application Priority Data

Nov. 25, 2015 (KR) .................. 10-2015-0165684

(51) Int. Cl.
| | |
|---|---|
| *H01L 23/522* | (2006.01) |
| *H01L 21/768* | (2006.01) |
| *H01L 23/528* | (2006.01) |
| *H01L 23/532* | (2006.01) |
| *H01L 27/1157* | (2017.01) |
| *H01L 27/11573* | (2017.01) |
| *H01L 27/11582* | (2017.01) |
| *H01L 27/11575* | (2017.01) |

(52) U.S. Cl.
CPC .. *H01L 21/76889* (2013.01); *H01L 21/76816* (2013.01); *H01L 21/76877* (2013.01); *H01L 23/528* (2013.01); *H01L 23/5226* (2013.01); *H01L 23/53266* (2013.01); *H01L 27/1157* (2013.01); *H01L 27/11573* (2013.01); *H01L 27/11575* (2013.01); *H01L 27/11582* (2013.01)

(58) Field of Classification Search
CPC ... H01L 21/768; H01L 23/522; H01L 23/528; H01L 23/532; H01L 27/115
See application file for complete search history.

(56) References Cited

U.S. PATENT DOCUMENTS

| | | |
|---|---|---|
| 8,338,882 B2 | 12/2012 | Tanaka et al. |
| 8,766,446 B2 | 7/2014 | Kuge et al. |
| 8,780,602 B2 | 7/2014 | Lue |
| (Continued) | | |

FOREIGN PATENT DOCUMENTS

| | | |
|---|---|---|
| JP | 2012-142556 A | 7/2012 |
| KR | 10-2014-0086640 A | 7/2014 |
| KR | 10-2015-0055189 A | 5/2015 |

*Primary Examiner* — Asok K Sarkar
*Assistant Examiner* — Dmitriy Yemelyanov
(74) *Attorney, Agent, or Firm* — Muir Patent Law, PLLC

(57) ABSTRACT

A semiconductor memory device is disclosed. The semiconductor memory device includes a substrate including cell and peripheral regions, a stack on the cell region, vertical channel portions vertically penetrating the stack, a contact structure penetrating the stack, an insulating structure on the peripheral region, an impurity region in the peripheral region of the substrate, and a first contact penetrating the insulating structure and connected to the impurity region. The stack includes gate electrodes sequentially stacked on the substrate, and the contact structure is spaced apart from the vertical channel portions. A top surface of the first contact is positioned at a lower level than that of the contact structure.

20 Claims, 21 Drawing Sheets

(56) References Cited

U.S. PATENT DOCUMENTS

| | | |
|---|---|---|
| 8,921,922 B2 | 12/2014 | Kim et al. |
| 9,087,861 B2 | 7/2015 | Hwang et al. |
| 9,299,713 B2 | 3/2016 | Jeon |
| 2009/0267128 A1* | 10/2009 | Maejima ............ H01L 27/11565 257/314 |
| 2012/0070944 A1* | 3/2012 | Kim .................... H01L 27/0688 438/128 |
| 2012/0168858 A1 | 7/2012 | Hong |
| 2014/0199815 A1* | 7/2014 | Hwang ............. H01L 29/66833 438/270 |

* cited by examiner

SEMICONDUCTOR MEMORY DEVICE AND METHOD OF FABRICATING THE SAME

CROSS-REFERENCE TO RELATED APPLICATIONS

This U.S. non-provisional patent application claims the benefit of priority under 35 U.S.C. § 119 to Korean Patent Application No. 10-2015-0165684, filed on Nov. 25, 2015, in the Korean Intellectual Property Office, the entire contents of which are hereby incorporated by reference.

BACKGROUND

The present disclosure relates to a semiconductor memory device, and in particular, to a semiconductor memory device with improved reliability.

Higher integration of semiconductor devices is often required to satisfy consumer demands for superior performance and lower product prices. In the case of typical two-dimensional or planar semiconductor devices, since their integration is mainly determined by the area occupied by a unit memory cell, integration is greatly influenced by the level of a fine pattern forming technology. However, the high costs of process equipment needed to increase pattern fineness sets a practical limitation on increasing integration for two-dimensional or planar semiconductor devices.

To overcome such a limitation, three-dimensional (3D) semiconductor devices including three-dimensionally-arranged memory cells have been proposed. However, there are significant manufacturing obstacles in achieving low-cost, mass-production of 3D semiconductor memory devices, particularly in the mass-fabrication of 3D devices that maintain or exceed the operational reliability of their 2D counterparts.

SUMMARY

According to certain exemplary embodiments, the disclosure is directed to a semiconductor memory device, comprising: a stack provided on the cell region, the stack comprising gate electrodes stacked on the substrate; vertical channel portions vertically penetrating the stack; a contact structure penetrating the stack, the contact structure being spaced apart from the vertical channel portions; an insulating structure provided on the peripheral region; an impurity region formed in the peripheral region of the substrate; and a first contact penetrating the insulating structure, the first contact being connected to the impurity region, wherein a top surface of the first contact is positioned at a lower level than a top surface of the contact structure.

According to certain exemplary embodiments, the disclosure is directed to a semiconductor memory device, comprising: a substrate including a cell region, a peripheral region, and a contact region formed around the cell region; a stack provided on the cell region and the contact region, the stack comprising gate electrodes stacked on the substrate; a vertical channel portion provided on the cell region to vertically penetrate the stack; a first contact provided on the contact region and connected to an end portion of a corresponding one of the gate electrodes; an insulating structure provided on the peripheral region; an impurity region formed in the peripheral region of the substrate; and a second contact penetrating the insulating structure on the peripheral region, the second contact being connected to the impurity region, wherein a top surface of the second contact is positioned at a different level from a top surface of the first contact.

According to certain exemplary embodiments, the disclosure is directed to a semiconductor memory device, comprising: a substrate including a cell region, a peripheral region, and a contact region formed around the cell region; a stack provided on the cell region and the contact region, the stack comprising gate electrodes vertically stacked on the substrate; a vertical channel portion provided on the cell region and vertically penetrating the stack; a contact structure provided on the cell region dividing the stack into a plurality of parts spaced apart from each other in a horizontal direction; a first contact provided on the contact region and connected to an end portion of a corresponding one of the gate electrodes; an insulating structure provided on the peripheral region; an impurity region formed in the peripheral region of the substrate; and a second contact penetrating the insulating structure, the second contact being connected to the impurity region, wherein a top surface of the second contact is positioned at a lower level than a top surface of the contact structure and a top surface of the first contact.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
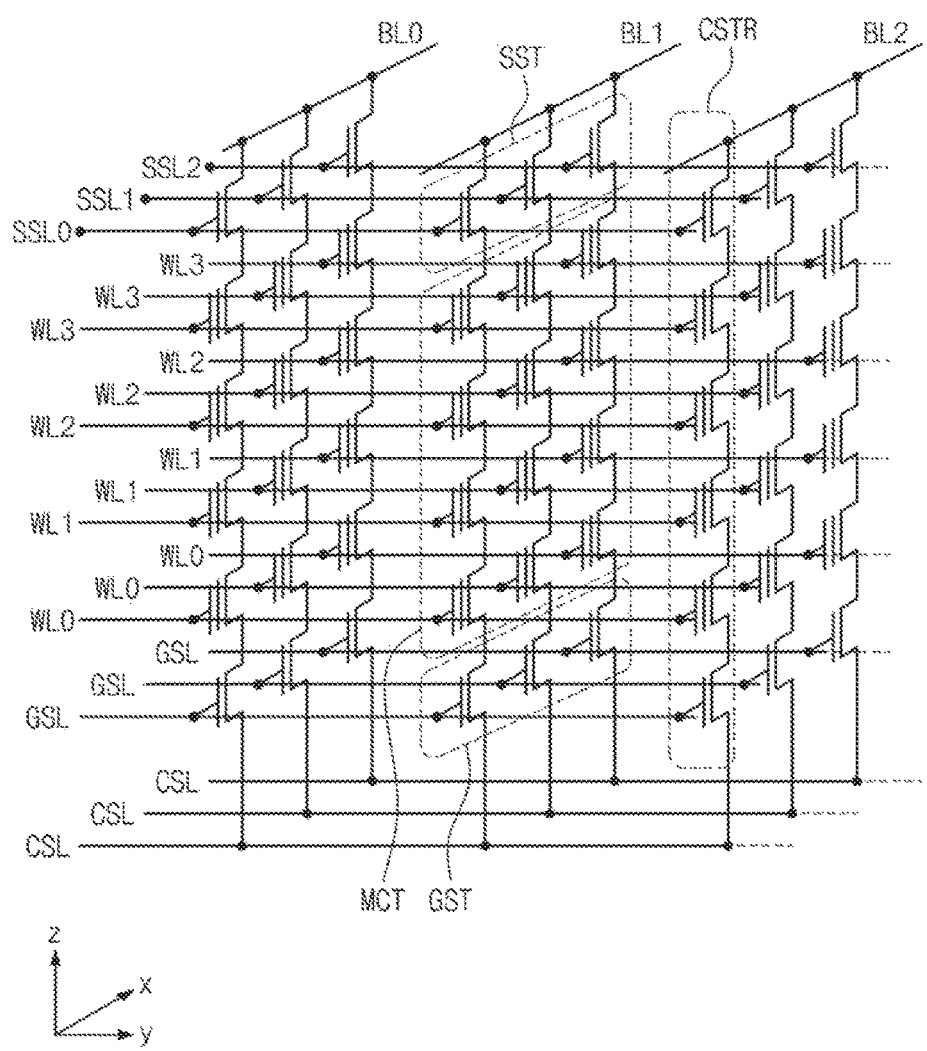
FIG. 1 is a circuit diagram schematically illustrating a portion of a cell array of a semiconductor memory device according to some exemplary embodiments.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

According to some exemplary embodiments, a method of fabricating a semiconductor memory device may include forming peripheral contacts on a peripheral region of a substrate and then forming cell gate electrodes on a cell region. In some embodiments, when the peripheral contacts are formed on the peripheral region before the cell gate electrodes are formed on the cell region, an uppermost surface of the contact that is formed in the peripheral region may be higher than an uppermost surface of a contact structure that is formed in the cell region.

FIG. 1 is a circuit diagram schematically illustrating a portion of a cell array of a semiconductor memory device according to some exemplary embodiments.

Referring to FIG. 1, a semiconductor memory device may include a common source line CSL, a plurality of bit lines BL0, BL1, and BL2, and a plurality of cell strings CSTR disposed between the common source line CSL and the bit lines BL0-BL2.

The common source line CSL may be a conductive layer disposed on a substrate (e.g., a semiconductor substrate) or an impurity region formed in the substrate. The bit lines BL0-BL2 may be conductive patterns (e.g., metal lines) disposed over the substrate and separated from the substrate. The bit lines BL0-BL2 may be two-dimensionally arranged on the substrate, and the plurality of cell strings CSTR may be electrically connected in parallel to each of the bit lines BL0-BL2. For example, each of the bit lines BL0-BL2 may extend in the X-direction and be spaced apart from one another in the Y-direction, and the plurality of cell strings may be perpendicular to the bit lines BL0-BL2 such that each of the plurality of cell strings CSTR extends in the Z-direction and the cell strings are spaced apart from one another in the X- and Y-directions. Accordingly, the cell strings CSTR may also be two-dimensionally arranged on the common source line CSL or the substrate.

Each of the cell strings CSTR may be configured to include a ground selection transistor GST connected to the common source line CSL, a string selection transistor SST connected to one of the bit lines BL0-BL2, and a plurality of memory cell transistors MCT disposed between ground and string selection transistors GST and SST. The ground selection transistor GST, the memory cell transistors MCT, and the string selection transistor SST constituting each of the cell strings CSTR may be serially connected to each other. Furthermore, a ground selection line GSL, a plurality of word lines WL0-WL3 and a plurality of string selection lines SSL0-SSL2 may be provided between the common source line CSL and the bit lines BL0-BL2 to serve as gate electrodes of the ground selection transistor GST, the memory cell transistors MCT, and the string selection transistors SST, respectively.

The ground selection transistors GST may be disposed at the substantially same level relative to the substrate (e.g., in the Z-direction), and the gate electrodes thereof may be connected in common to the ground selection line GSL, thereby being in an equipotential state. Accordingly, the ground selection line GSL may be disposed between the common source line CSL and the lowermost ones of the memory cell transistors MCT adjacent thereto. Similarly, the gate electrodes of the memory cell transistors MCT located at the same level may also be connected in common to one of the word lines WL0-WL3, thereby being in an equipotential state. Since each of the cell strings CSTR includes a plurality of the memory cell transistors MCT disposed at different levels from each other relative to the substrate (e.g., in the Z-direction), the word lines WL0-WL3 may have a multi-layered structure between the common source line CSL and the bit lines BL0-BL2.

In some embodiments, the ground and string selection transistors GST and SST and the memory cell transistors MCT may be metal-oxide-semiconductor field effect transistors (MOSFETs), in which the channel structures are used as channel regions. In other example embodiments, the channel structure, in conjunction with the ground selection line GSL, the word lines WL0-WL3, and the string selection lines SSL, may constitute metal-oxide-semiconductor (MOS) capacitors. In this case, if a voltage higher than a threshold voltage of the MOS capacitor is applied to the ground selection line GSL, the word lines WL0-WL3, and the string selection lines SSL, a fringe field may be produced to form an inversion layer between the word lines WL0 to WL3, and the formation of the inversion layer may allow the ground selection transistor GST, the memory cell transistors MCT, and the string selection transistor SST to be electrically connected to each other.

Figure 2:
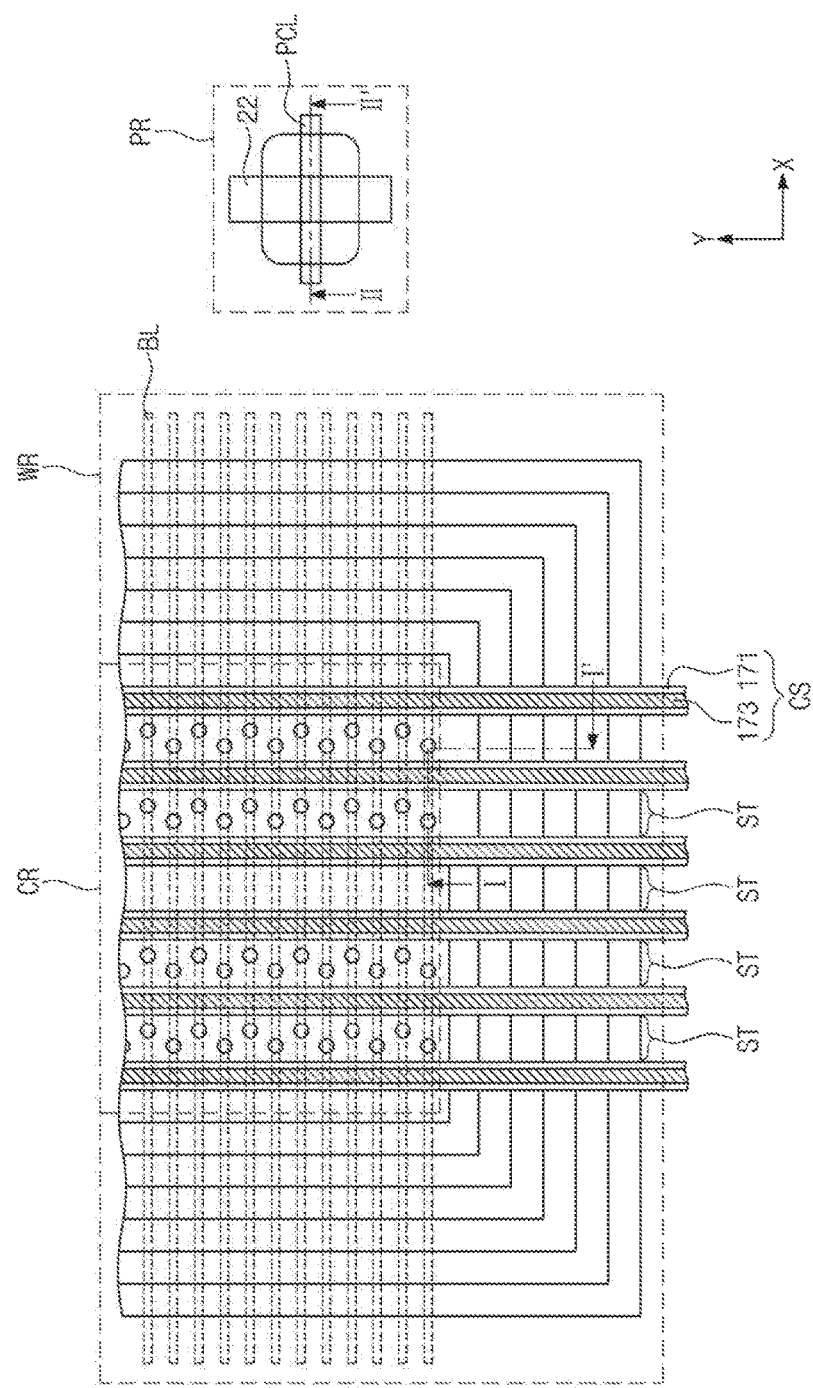
FIG. 2 is a plan view of a semiconductor memory device according to some exemplary embodiments.
Figure 3:
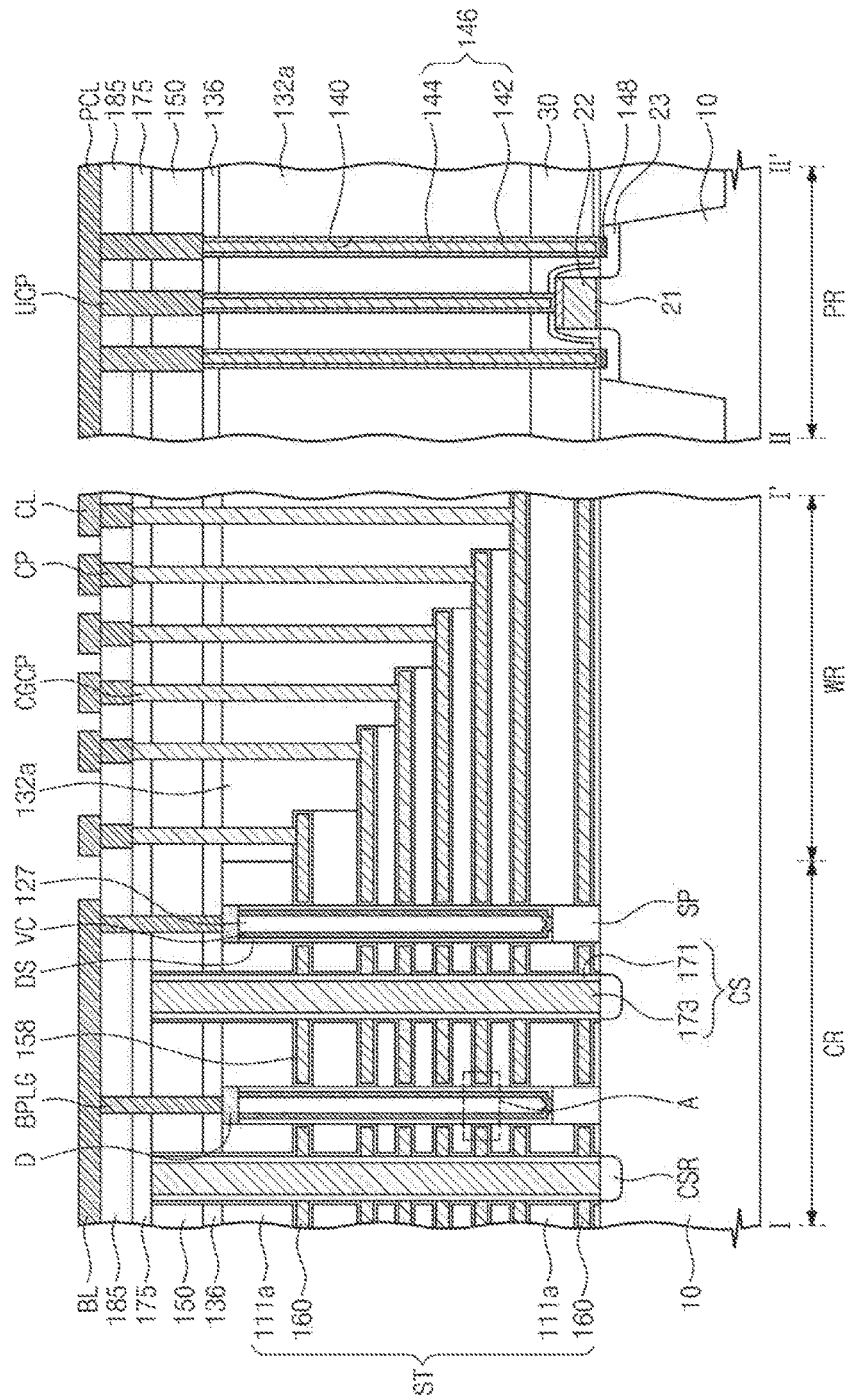
FIG. 3 is a sectional view, which is taken along lines I-I' and II-II' of FIG. 2, to illustrate a semiconductor memory device according to some exemplary embodiments.

FIG. 2 is a plan view of a semiconductor memory device according to some exemplary embodiments. FIG. 3 is a sectional view, which is taken along lines I-I' and II-II' of FIG. 2, to illustrate a semiconductor memory device according to some exemplary embodiments.

Referring to FIGS. 2 and 3, a stack ST and a peripheral circuit transistor may be provided on a substrate 10. The substrate 10 may include a cell region CR, a peripheral region PR, and a contact region WR provided around the cell region CR. The substrate 10 may be a silicon substrate, a silicon-germanium substrate, a germanium substrate, or a single-crystalline epitaxial layer grown on a single-crystalline silicon substrate.

A peripheral circuit transistor may be provided on the peripheral region PR. For example, the peripheral circuit transistor may be integrated on an active region of the substrate 10 that is defined by a device isolation layer. The peripheral circuit transistor may be used as a part of a word line driver, a sense amplifier, row and column decoders, or a control circuit.

The peripheral circuit transistor may include a peripheral gate insulating pattern 21 and a peripheral gate pattern 22 sequentially stacked on the peripheral region PR. The peripheral gate pattern 22 may be used as a gate electrode of the peripheral circuit transistor. The peripheral gate pattern 22 may include at least one of doped polysilicon or metallic materials. The peripheral gate insulating pattern 21 may be disposed between the peripheral gate pattern 22 and the substrate 10. The peripheral gate insulating pattern 21 may be formed of or may include at least one of a thermally-grown silicon oxide layer or high-k dielectric layers. Peripheral impurity regions 23 may be formed in the active region of the substrate 10 and at both sides of the peripheral gate pattern 22. The peripheral impurity regions 23 may be used as source/drain regions of the peripheral circuit transistor. A peripheral insulating pattern 30 may be formed on the peripheral region PR to cover the peripheral gate pattern 22. The peripheral insulating pattern 30 may be formed of or may include a silicon oxide layer.

The stack ST may be provided on the cell region CR and contact region WR. In some embodiments, a plurality of stacks ST may be provided on the substrate 10 to be spaced apart from each other in a first direction (e.g., the X-direction) and extend in a second direction crossing the first direction (e.g., extending in the Y-direction and perpendicular to the X-direction). A cell impurity region CSR may be formed in a region of the substrate 10 between the stacks ST. The cell impurity region CSR may extend in the second direction (e.g., the Y-direction). The cell impurity region CSR may serve as the common source line CSL shown in FIG. 1. In this exemplary embodiment, the cell impurity region CSR may be doped to have a conductivity type different from the substrate 10.

The stack ST may include insulating patterns 111a, which are stacked on the substrate 10 in a vertical direction perpendicular to a top surface of the substrate 10 (e.g., the Z-direction), and gate electrodes 160, each of which is interposed between a corresponding pair of the insulating patterns 111a. For example, the insulating patterns 111a and the gate electrodes 160 may be alternatingly stacked on the substrate 10. Thicknesses of the insulating patterns 111a may be variously changed, depending on technical features required for the semiconductor memory device. For example, the insulating pattern 111a disposed between the lowermost and next-lowermost ones of the gate electrodes 160 may be thicker than others of the insulating patterns 111a. The insulating patterns 111a may be formed of or may include, for example, silicon oxide.

The gate electrodes 160 may be disposed between the insulating patterns 111a. The gate electrodes 160 may extend in the second direction (i.e., the Y-direction). The gate electrodes 160 of each stack ST may have different lengths in the second direction Y. For example, the lengths of the gate electrodes 160 in the second direction Y may decrease with increasing distance from the substrate 10. Similar to the lengths of the gate electrodes 160, the insulating patterns 111a of each stack ST may have different lengths in the second direction Y. For example, the length in the second direction Y of each of the insulating patterns 111a may be substantially equal to that of the gate electrode 160 thereon. That is, each of the gate electrodes 160 may be provided to cover an end portion of an underlying corresponding one of the insulating patterns 111a. As a result, the stack ST may have a stepwise structure on the contact region WR. The gate electrodes 160 may be formed of or may include at least one of doped silicon, metals (e.g., tungsten, copper, aluminum, etc.), conductive metal nitrides (e.g., titanium nitride, tantalum nitride, etc.), or transition metals (e.g., titanium, tantalum, etc.).

A vertical channel portion VC may be provided on the cell region CR to penetrate the stack ST. In some embodiments, a plurality of the vertical channel portions VC may be provided to form a linear or zigzag arrangement in the first direction X, when viewed in a plan view. Each of the vertical channel portions VC may be provided to have a hollow pipe shape, a hollow cylindrical shape, or a cup shape. The vertical channel portion VC may be formed of or may include a semiconductor material. For example, the vertical channel portion VC may be formed of or may include at least one of a poly silicon layer, an organic semiconductor layer, or carbon nano structures.

A charge storing structure DS may be provided between the vertical channel portion VC and the stack ST. For example, the charge storing structure DS may be disposed between the gate electrodes 160 and the vertical channel portion VC and may extend along a side surface of the vertical channel portion VC or in the vertical direction (i.e., the Z-direction). The charge storing structure DS may be provided to enclose an outer side surface of the vertical channel portion VC, which may surround a capping layer 127.

Figure 4:
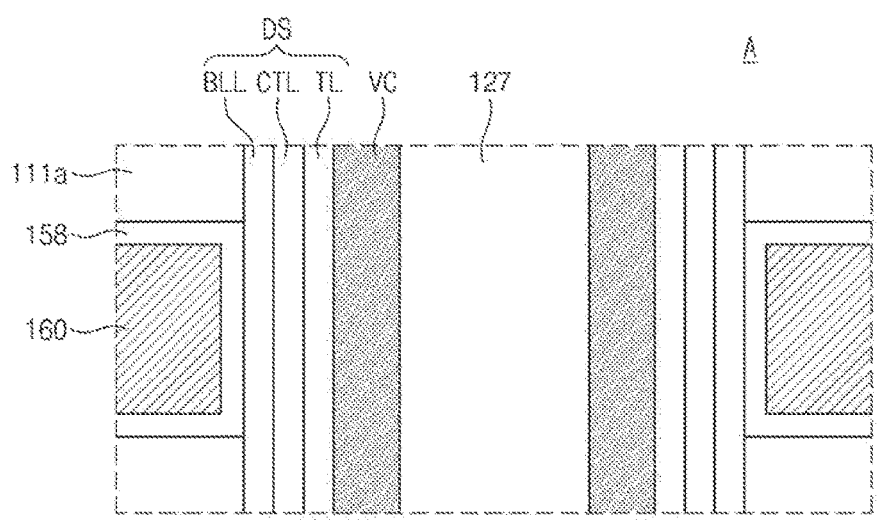
FIG. 4 is an enlarged view of a portion 'A' of FIG. 3.

As shown in FIG. 4, the charge storing structure DS may include a blocking insulating layer BLL, a charge storing layer CTL, and a tunnel insulating layer TL. The blocking insulating layer BLL may be provided between the vertical channel portion VC and the gate electrodes 160, and the tunnel insulating layer TL may be provided between the blocking insulating layer BLL and the vertical channel portion VC. The charge storing layer CTL may be provided between the blocking insulating layer BLL and the tunnel insulating layer TL. In some embodiments, the blocking insulating layer BLL may surround the charge storing layer CTL.

The charge storing structure DS may include at least one of a silicon oxide layer, a silicon nitride layer, or a silicon oxynitride layer. For example, the blocking insulating layer BLL may include at least one of a silicon oxide layer or high-k dielectric layers (e.g., aluminum oxide ($Al_2O_3$), hafnium oxide ($HfO_2$)), the charge storing layer CTL may include a silicon nitride layer, and the tunnel insulating layer TL may include at least one of a silicon oxide layer or high-k dielectric layers (e.g., aluminum oxide ($Al_2O_3$)), hafnium oxide ($HfO_2$)).

A capping layer 127 may be provided in an internal space defined by the vertical channel portion VC. The capping layer 127 may be formed of or may include an insulating material (e.g., silicon oxide, silicon nitride, silicon oxynitride, etc.).

Referring again to FIG. 3, a pad D may be provided on the vertical channel portion VC to cover the capping layer 127. The pad D may be electrically connected to the vertical channel portion VC. The pad D may be formed of or may include a conductive material or a doped semiconductor material, whose conductivity type is different from that of the vertical channel portion VC.

A semiconductor pillar SP may be provided between the vertical channel portion VC and the substrate 10. The semiconductor pillar SP may be provided on the top surface of the substrate 10 and may penetrate the lowermost one of the gate electrodes 160. For example, the semiconductor pillar SP may be provided on the uppermost surface of the substrate 10 and extend in a vertical direction to a bottom surface of the vertical channel portion VC. The vertical channel portion VC may be electrically connected to the semiconductor pillar SP. The semiconductor pillar SP may be formed of a doped semiconductor material, which is of the same conductivity type as that of the substrate 10, or an intrinsic semiconductor material. The semiconductor pillar SP may be formed of or may include, for example, a single-crystalline intrinsic semiconductor material or a single-crystalline p-type semiconductor material.

A first interlayer insulating pattern 132a may be provided on the contact and peripheral regions WR and PR. The first interlayer insulating pattern 132a may be provided to cover the stepwise portion of the stack ST on the contact region WR and to cover a top surface of the peripheral insulating pattern 30 on the peripheral region PR. The first interlayer insulating pattern 132a may have a top surface that is substantially coplanar with a top surface of the uppermost one of the insulating patterns 111a and a top surface of the pad D. The first interlayer insulating pattern 132a may be formed of or may include at least one of, for example, silicon oxide or silicon nitride.

A second interlayer insulating layer 136 may be provided on the cell, contact, and peripheral regions CR, WR, and PR. For example, the second interlayer insulating layer 136 may be provided to cover the top surface of the uppermost one of the insulating patterns 111a, the top surface of the pad D, and the top surface of the first interlayer insulating pattern 132a. The second interlayer insulating layer 136 may be formed of or may include at least one of, for example, silicon oxide or silicon nitride.

Peripheral contacts 146 may be provided on the peripheral region PR. The peripheral contacts 146 may be vertical contacts or pillars, and may extend in a vertical direction. The peripheral contacts 146 may be provided to penetrate the peripheral insulating pattern 30, the first interlayer insulating pattern 132a, and the second interlayer insulating layer 136 stacked on the peripheral region PR, and each of the peripheral contacts 146 may be electrically connected to at least one of the peripheral impurity regions 23 or the peripheral gate pattern 22. The peripheral contacts 146 may have top surfaces that are substantially coplanar with a top surface of the second interlayer insulating layer 136, and the top surfaces of the peripheral contacts 146 may be positioned at a higher level than the top surface of the pad D.

Each of the peripheral contacts 146 may include a first metal layer 142 and a second metal layer 144. At least a portion of the first metal layer 142 may have a hollow pipe shape, a hollow cylindrical shape, or a cup shape. A bottom surface of the first metal layer 142 may be in contact with the peripheral impurity regions 23 or the peripheral gate pattern 22. The first metal layer 142 may be formed of or may include at least one of cobalt (Co), titanium (Ti), nickel (Ni), or tungsten (W). The second metal layer 144 may be provided in an internal space defined by the first metal layer 142. The second metal layer 144 may include at least one layer. For example, the second metal layer 144 may be formed of or may include at least one of metals (e.g., tungsten, copper, and aluminum) or conductive metal nitrides (e.g., titanium nitride and tantalum nitride).

A silicide layer 148 may be provided on the peripheral impurity regions 23. The silicide layer 148 may be disposed between the first metal layer 142 of the peripheral contact 146 and the substrate 10. The silicide layer 148 may be formed to contain the same metallic elements as those of the first metal layer 142. For example, in the case where the first metal layer 142 is formed of titanium (Ti), the silicide layer 148 may be a titanium silicide (TiSi$_x$) layer. Although not illustrated, the silicide layer 148 may be provided between the first metal layer 142 and the peripheral gate pattern 22.

A third interlayer insulating layer 150 may be provided on the second interlayer insulating layer 136. The third interlayer insulating layer 150 may be provided to cover the top surface of the second interlayer insulating layer 136 and the top surfaces of the peripheral contacts 146. The third interlayer insulating layer 150 may be formed of or may include at least one of, for example, silicon oxide or silicon nitride.

A contact structure CS may be provided between the stacks ST. The contact structure CS may be provided on the substrate 10 and may be connected to the cell impurity region CSR. The contact structure CS may extend in the cell impurity region CSR or parallel to the second direction (e.g., the Y-direction). For example, when viewed in a plan view, the contact structure CS may be shaped like a rectangle or line that is elongated in the second direction.

The contact structure CS may extend in the vertical direction (e.g., the Z-direction) and may penetrate the third and second interlayer insulating layers 150 and 136, which are provided on the cell region CR, and the first interlayer insulating pattern 132a, which is provided on the contact region WR. The contact structure CS may have a top surface that is substantially coplanar with that of the third interlayer insulating layer 150 and is positioned at a higher level than those of the peripheral contacts 146. For example, the top surface of the contact structure CS may be coplanar in a horizontal plane with that of the third interlayer insulating layer 150.

The contact structure CS may include a spacer 171 and a common source contact 173. The common source contact 173 may be connected to the cell impurity region CSR of the substrate 10. The common source contact 173 may be formed of or may include at least one of metals (e.g., tungsten, copper, aluminum, etc.) or transition metals (e.g., titanium, tantalum, etc.). The spacer 171 may be disposed between the common source contact 173 and the stack ST. The spacer 171 may be formed of or include at least one of insulating materials (e.g., silicon oxide, silicon nitride, etc.).

A fourth interlayer insulating layer 175 may be provided on the third interlayer insulating layer 150. The fourth interlayer insulating layer 175 may cover the top surface of the third interlayer insulating layer 150 and the top surface of the contact structure CS. The fourth interlayer insulating layer 175 may be formed of or may include at least one of, for example, silicon oxide or silicon nitride.

Cell contact plugs CGCP may be provided on the contact region WR. The cell contact plugs CGCP may be provided to penetrate the first interlayer insulating pattern 132a, as well as the second, the third and the fourth interlayer insulating layers 136, 150, and 175, and thereby to be connected to end portions of the gate electrodes 160 on the contact region WR. Each of the cell contact plugs CGCP may be electrically connected to a corresponding one of the gate electrodes 160. The cell contact plug CGCP, which is provided on and connected to the end portion of the uppermost one of the gate electrodes 160, may penetrate the uppermost one of the insulating patterns 111a and the second to fourth interlayer insulating layers 136, 150, and 175. The cell contact plugs CGCP may be formed of or may include at least one of metals (e.g., tungsten, copper, aluminum, etc.), conductive metal nitrides (e.g., titanium nitride, tantalum nitride, etc.), or transition metals (e.g., titanium, tantalum, etc.).

The fourth interlayer insulating layer 175 may be provided to expose top surfaces of the cell contact plugs CGCP. The top surfaces of the cell contact plugs CGCP may be positioned at a higher level (e.g., a level in the Z-direction) than the top surfaces of the contact structure CS and the peripheral contacts 146.

A fifth interlayer insulating layer 185 may be provided on the fourth interlayer insulating layer 175. The fifth interlayer insulating layer 185 may be provided to cover the top surfaces of the cell contact plugs CGCP and the top surface of the fourth interlayer insulating layer 175.

A bit line contact plug BPLG may be provided on the cell region CR. The bit line contact plug BPLG may be provided on the cell region CR to penetrate the second, the third, the fourth and the fifth interlayer insulating layers 136, 150, 175, and 185, and may be connected to the pad D.

Contacts CP may be provided on the contact region WR. The contacts CP may be provided to penetrate the fifth interlayer insulating layer 185 and may be connected to the cell contact plugs CGCP, respectively. Peripheral contact plugs UCP may be provided on the peripheral region PR. The peripheral contact plugs UCP may be provided to penetrate the third, the fourth, and the fifth interlayer insulating layers 150, 175, and 185, and may be connected to the peripheral contacts 146. The bit line contact plug BPLG, the contacts CP, and the peripheral contact plugs UCP may be formed of or may include a metallic material (e.g., tungsten and aluminum).

Bit lines BL may be provided on the fifth interlayer insulating layer 185, and the bit line contact plug BPLG may be connected to a corresponding one of the bit lines BL. The bit lines BL may be provided to extend in the first direction (e.g., the X-direction) or cross the stacks ST, as shown in FIG. 1. Each of the bit lines BL may be connected to a plurality of the vertical channel portions VC arranged in the first direction.

Connection lines CL may be provided on the fifth interlayer insulating layer 185 or on the contact region WR and may be connected to the contacts CP. Although not illustrated, each of the connection lines CL may be connected to at least one of the contacts CP, each of which is connected to a corresponding one of the gate electrodes 160 positioned adjacent to each other and at the same level.

On the peripheral region PR and on the fifth interlayer insulating layer 185, a peripheral circuit line PCL may be provided to connect the peripheral contact plugs UCP to each other. For example, as shown in FIG. 2, the peripheral circuit line PCL may be extended from the cell region CR to the peripheral region PR. For example, the peripheral circuit line PCL may extend in the X-direction from the cell region CR to the peripheral region PR. In some embodiments, memory cells of the cell region CR may be electrically connected to peripheral circuits of the peripheral region PR through the peripheral circuit lines PCL.

Figure 5:
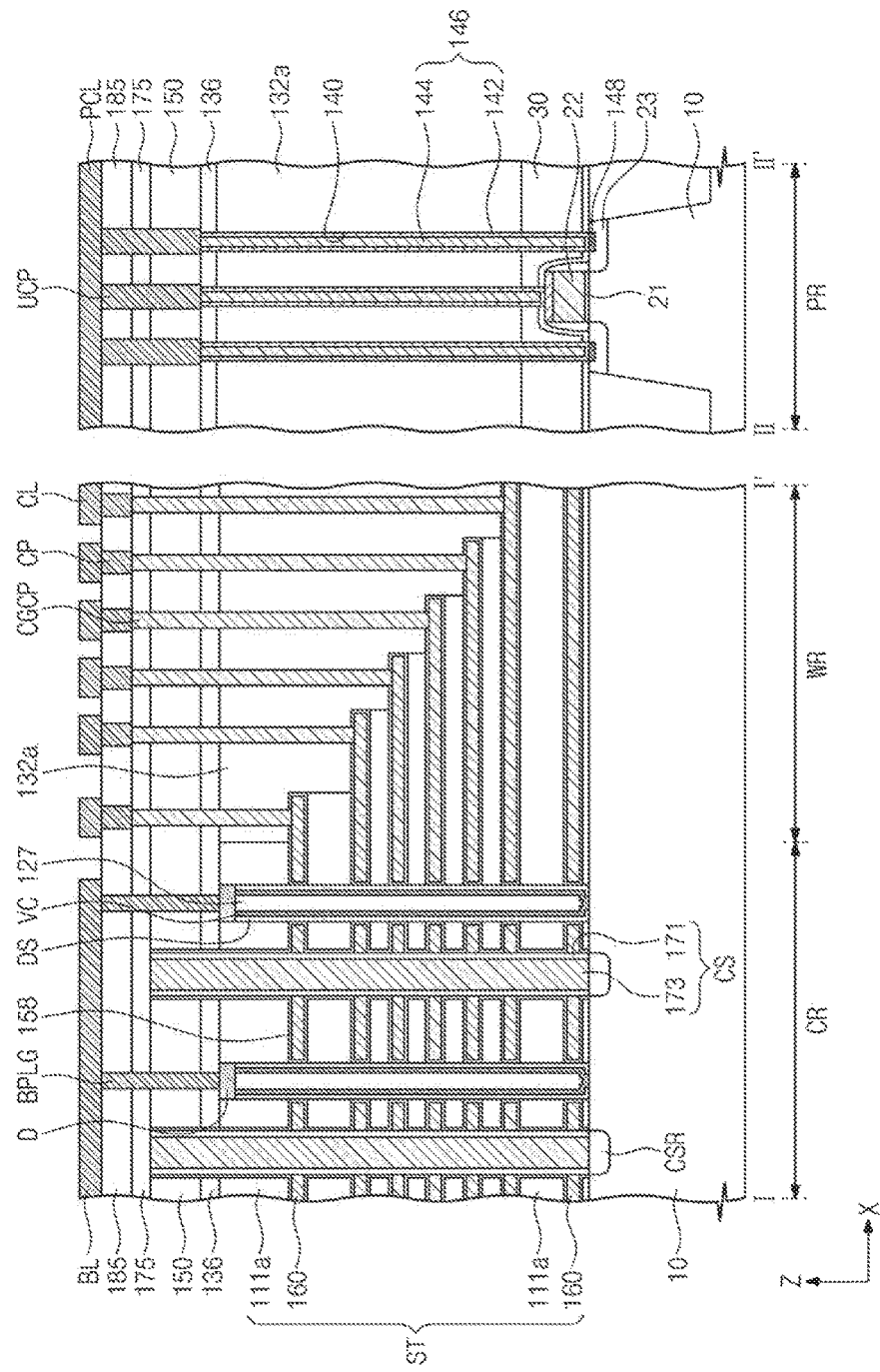
FIG. 5 is a sectional view, which is taken along lines I-I' and II-II' of FIG. 2, to illustrate a semiconductor memory device according to some exemplary embodiments.

FIG. 5 includes sectional views taken along lines I-I' and II-II' of FIG. 2 to illustrate a semiconductor memory device according to some exemplary embodiments. For concise description, previously described elements may be identified by similar or identical reference numbers without repeating an overlapping description thereof.

Referring to FIG. 5, the vertical channel portion VC may be provided on the cell region CR. The vertical channel portion VC may be provided to penetrate each of the stacks ST and to be connected to the top surface of the substrate 10. The vertical channel portion VC may have a hollow pipe shape, a hollow cylindrical shape, or a cup shape.

The charge storing structure DS may be provided between the vertical channel portion VC and the gate electrodes 160. The charge storing structure DS may extend in the vertical direction or in a direction perpendicular to the top surface of the substrate 10 (e.g., the Z-direction). When viewed in a plan view, the charge storing structure DS may have a structure enclosing an outer side surface of the vertical channel portion VC. A portion of the charge storing structure DS may cover the top surface of the substrate 10.

Figure 6:
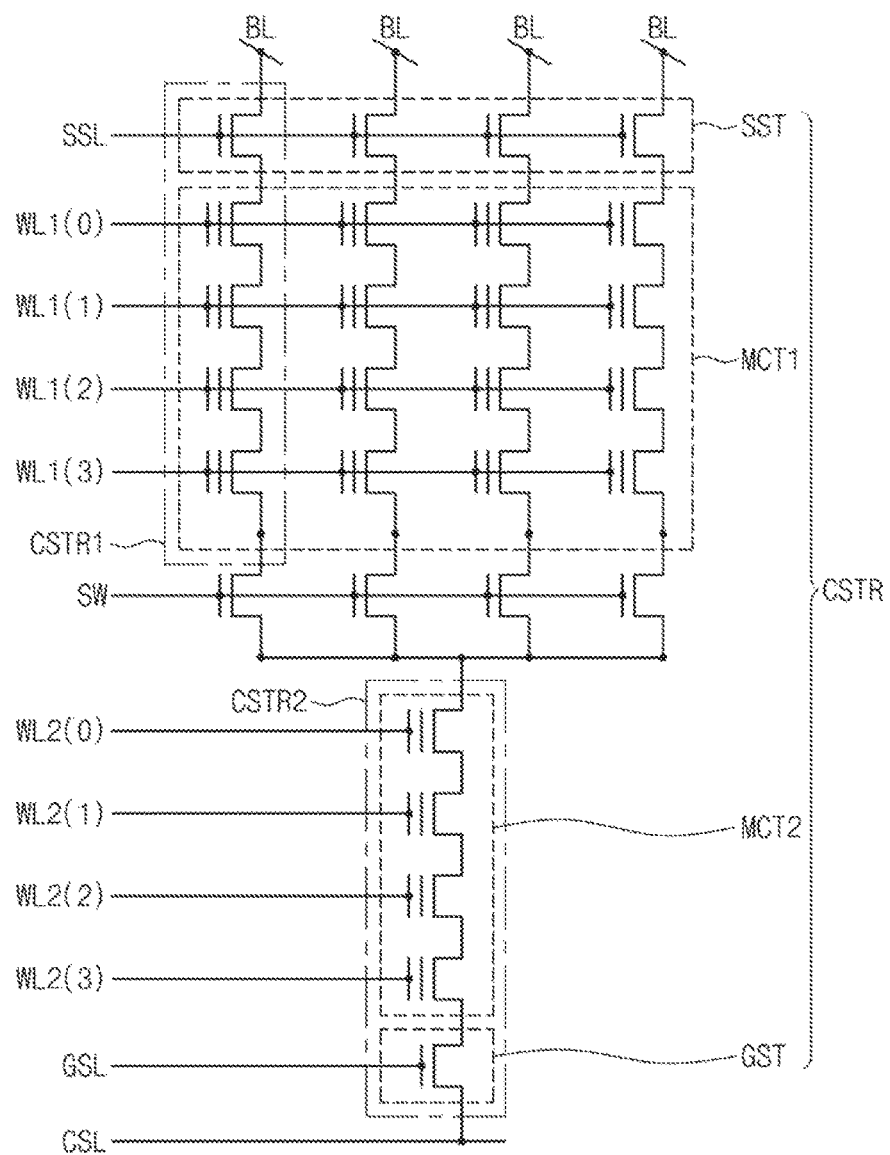
FIG. 6 is a circuit diagram illustrating a cell array of a semiconductor memory device according to some exemplary embodiments.

FIG. 6 is a circuit diagram illustrating a cell array of a semiconductor memory device according to some exemplary embodiments.

Referring to FIG. 6, an exemplary semiconductor memory device may include a common source line CSL, a plurality of bit lines BL, and a cell string CSTR between the common source line CSL and the bit lines BL.

In certain embodiments, the common source line CSL may be a conductive pattern provided on a substrate 10, and the bit lines BL may be metal patterns provided on the substrate 10.

The cell string CSTR may include a plurality of upper strings CSTR1, each of which is connected to one of the bit lines BL, and a single lower string CSTR2, which is connected to the common source line CSL. The plurality of upper strings CSTR1 may be connected in common to the single lower string CSTR2. In some embodiments, each of the upper strings CSTR1 may be connected to the lower string CSTR2 through a switching device SW. The switching devices SW connected to the upper strings CSTR1 may be controlled by the same voltage.

Each of the upper strings CSTR1 may include a string selection transistor SST, which is connected to a corresponding one of the bit lines BL, and a plurality of upper memory cell transistors MCT1, which are provided between the string selection transistor SST and the switching device SW. The string selection transistor SST and the upper memory cell transistors MCT1 may be connected in series. The lower string CSTR2 may include a ground selection transistor GST, which is connected to the common source line CSL, and a plurality of lower memory cell transistors MCT2, which are provided between the ground selection transistor GST and the switching devices SW. The ground selection transistor GST and the lower memory cell transistors MCT2 may be connected in series.

The string selection line SSL and upper word lines WL1(0)-WL1(3), which are provided between the bit lines BL and the switching devices SW, may be respectively used as gate electrodes of the string selection transistor SST and the upper memory cell transistors MCT1. Ground selection line GSL and lower word lines WL2(0)-WL2(3), which are provided between the common source line CSL and the switching devices SW, may be respectively used as gate electrodes of the ground selection transistor GST and the lower memory cell transistors MCT2. Each of the upper and lower memory cell transistors MCT1 and MCT2 may include a data storing element.

The plurality of upper strings CSTR1, each connected to a respective one of the bit lines BL, may be connected in common to the single lower string CSTR2, which is connected to the common source line CSL. Accordingly, the plurality of upper strings CSTR1 may share the ground selection transistor GST of the single lower string CSTR2. Since the upper strings CSTR1 are connected to a respective one of the bit lines BL, the upper strings CSTR1 can be independently controlled. Furthermore, since the plurality of upper strings CSTR1 are connected in common to the single lower string CSTR2 and share the ground selection transistor GST, it is possible to realize a highly integrated semiconductor device.

Figure 7:
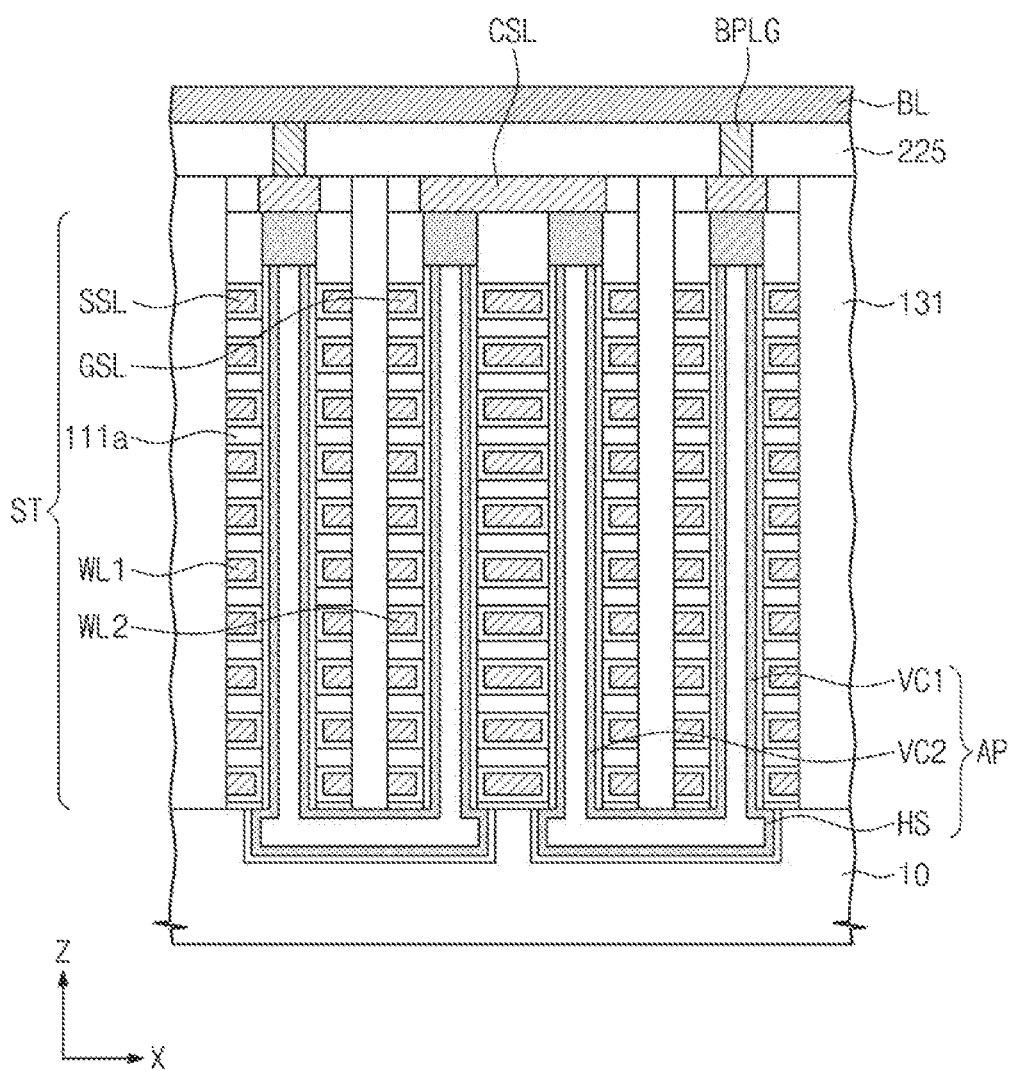
FIG. 7 is a sectional view of the exemplary semiconductor memory device of FIG. 6.

FIG. 7 is a sectional view of the exemplary semiconductor memory device of FIG. 6. For concise description, elements previously described with reference to FIG. 3 may be identified by a similar or identical reference number without repeating an overlapping description thereof.

Referring to FIG. 7, a plurality of the stacks ST may be provided on the substrate 10 and a plurality of the vertical channel portions VC may be provided to penetrate the stacks ST. Each of the stacks ST may include electrodes and the insulating patterns 111a, which are alternatingly stacked on the substrate 10 (e.g., stacked in a Z-direction). In some embodiments, the stacks ST may extend in a specific direction (e.g., extending in an X- and/or Y-direction), and an isolation structure 131 may be provided between the stacks ST. The isolation structure 131 may be formed of or include at least one of insulating materials (e.g., silicon oxide, silicon nitride, and silicon oxynitride). For example, the isolation structure 131 may be formed to electrically isolate the stacks ST by extending in a vertical direction, insulating the stacks ST from one another.

In some embodiments, the isolation structure 131 may have a top surface that is positioned at a higher level than that of the peripheral contact 146 shown in FIG. 3.

The electrodes may include a string selection line SSL, word lines WL, and a ground selection line GSL. The string selection line SSL may be disposed between the word lines WL and the bit lines BL. The ground selection line GSL may be disposed between the word lines WL and the common source line CSL. The word lines WL may be vertically stacked on the substrate 10 (e.g., in a Z-direction). The string selection line SSL and the ground selection line GSL may be disposed over the word lines WL. For example, the string selection line SSL and the ground selection line GSL may be formed at a vertical level higher than the word lines WL, relative to the substrate 10. The string selection line SSL and the ground selection line GSL may be spaced apart from each other in a horizontal direction (e.g., in an X- and/or a Y-direction). The word lines WL may include upper word lines WL1 disposed between the substrate 10 and the string selection line SSL and lower word lines WL2 disposed between the substrate 10 and the ground selection line GSL. The upper word lines WL1 and the lower word lines WL2 may be spaced apart from each other in the horizontal direction (e.g., in an X- and/or a Y-direction).

An interlayer insulating layer 225 may be provided between the stacks ST and the bit lines BL. The interlayer insulating layer 225 may include the fourth and the fifth interlayer insulating layers 175 and 185 shown in FIG. 3.

Each of active patterns AP may include vertical channel portions VC1 and VC2, which are provided to penetrate the stacks ST, and a horizontal portion HS, which is provided below the stacks ST to connect the vertical channel portions VC1 and VC2 to each other. The vertical channel portions VC1 and VC2 may be provided in vertical holes, which are formed to penetrate the stacks ST. The horizontal portion HP may be provided in the horizontal recess, which is formed in a top portion of the substrate 10. One of the vertical channel portions (e.g., VC2) may be connected to the common source line CSL, and another of the vertical channel portions (e.g., VC1) may be connected to a corresponding one of the bit lines BL. The horizontal portion HP may be provided between the substrate 10 and the stacks ST to connect the vertical channel portions VC1 and VC2 to each other.

For example, in each of the active patterns AP, the vertical channel portions VC1 and VC2 may include a first vertical channel portion VC1 penetrating the upper word lines WL1 and the string selection line SSL and a second vertical channel portion VC2 penetrating the lower word lines WL2 and the ground selection line GSL. The first vertical channel portion VC1 may be connected to one of the bit lines BL, and the second vertical channel portion VC2 may be connected to the common source line CSL. The horizontal portion HS may extend from a region below the upper word lines WL1 to a region below the lower word lines WL2, thereby connecting the first vertical channel portion VC1 to the second vertical channel portion VC2.

Each of the active patterns AP may include a semiconductor pattern, which is provided to penetrate the stack ST and is electrically connected to the substrate 10. In the vertical channel portions VC1 and VC2, the semiconductor pattern may be provided to cover an inner surface of a vertical hole penetrating the stacks ST. In the horizontal portion HP, the semiconductor pattern may be provided to cover an inner surface of a horizontal recess of the substrate 10. The semiconductor pattern may be formed of or include a semiconductor material.

FIGS. 8 through 21 are sectional views, which are taken along lines I-I' and II-II' of FIG. 2, to illustrate a method of fabricating a semiconductor memory device according to some exemplary embodiments.

Figure 8:
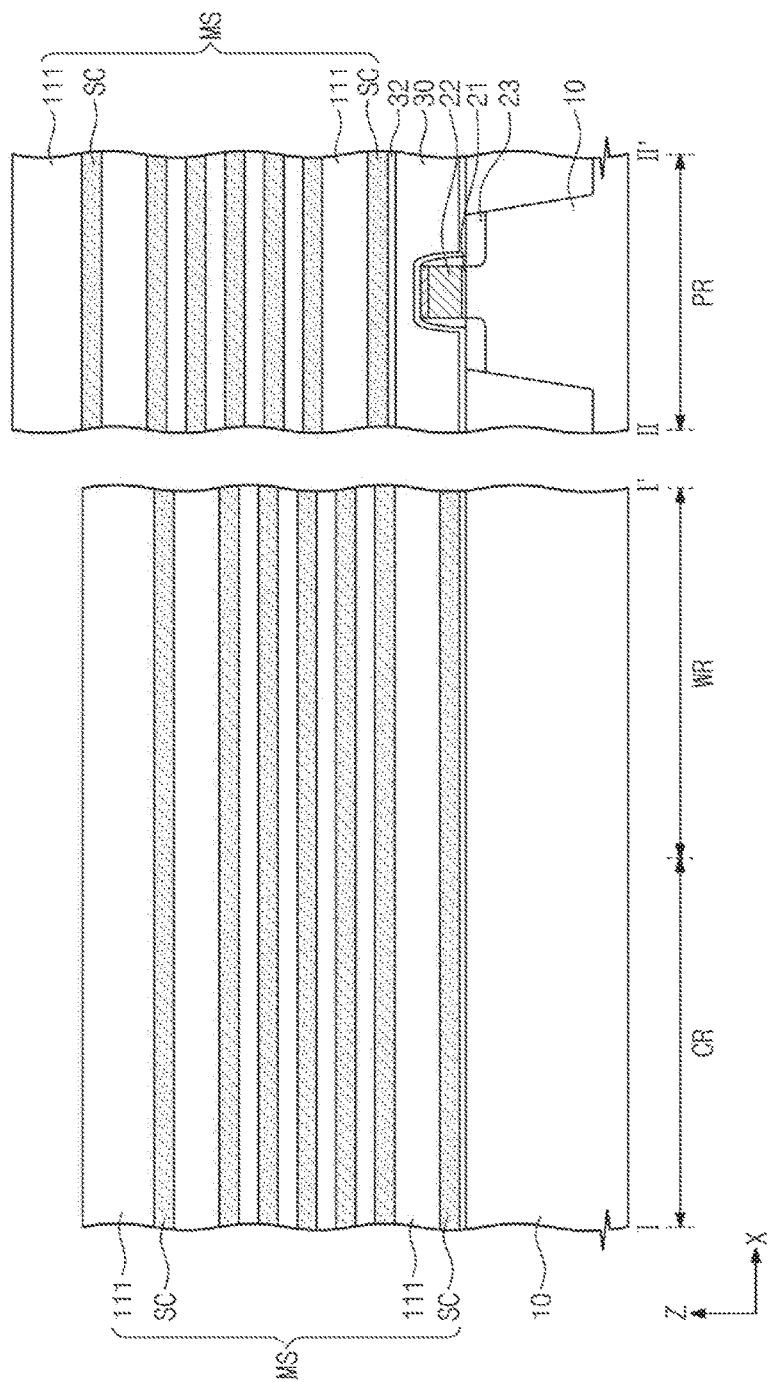
FIGS. 8 through 21 are sectional views, which are taken along lines I-I' and II-II' of FIG. 2, to illustrate a method of fabricating a semiconductor memory device according to some exemplary embodiments.

Referring to FIG. 8, a substrate 10 may be prepared. The substrate 10 may include a cell region CR, a peripheral region PR, and a contact region WR provided around the cell region CR. The substrate 10 may be a silicon substrate, a silicon-germanium substrate, a germanium substrate, or a single-crystalline epitaxial layer grown on a single-crystalline silicon substrate. The substrate 10 may include an active region defined by a device isolation layer. Peripheral circuits for writing data to and/or reading data from memory cells may be formed on the peripheral region PR.

For example, the peripheral circuits may include a word line driver, a sense amplifier, row and column decoders, and control circuits. In some embodiments, as illustrated in the drawings, a peripheral circuit transistor constituting the peripheral circuits may be formed on the peripheral region PR.

In some exemplary embodiments, the peripheral circuit transistor may be formed by the following process. A peripheral gate insulating layer (not shown) and a peripheral gate layer (not shown) may be sequentially formed on the substrate 10. Here, the peripheral gate insulating layer may be used as a gate insulating layer of the peripheral circuit transistor and may be a silicon oxide layer formed by a thermal oxidation process. Thereafter, the peripheral gate insulating layer and the peripheral gate layer may be patterned to form a peripheral gate insulating pattern 21 and a peripheral gate pattern 22, which are sequentially stacked on the substrate 10. For example, the peripheral gate insulating pattern 21 may be formed between the substrate 10 and the peripheral gate pattern 22.

The peripheral gate pattern 22 may be used as a gate electrode of the peripheral circuit transistor constituting the peripheral circuits. The peripheral gate pattern 22 may be formed of at least one of doped polysilicon or metallic materials. Thereafter, peripheral impurity regions 23, which may be used as source/drain regions of the peripheral circuit transistor, may be formed in the active region of the substrate 10 and at both sides of the peripheral gate pattern 22.

Next, a peripheral insulating pattern 30 may be formed on the substrate 10 provided with the peripheral circuit transistor. The peripheral insulating pattern 30 may cover the peripheral circuit transistor, which is formed on the peripheral region PR. In some embodiments, after the formation of the peripheral circuit transistor on the peripheral region PR, the peripheral insulating pattern 30 may be formed by depositing an insulating layer on the substrate 10 and removing the insulating layer from the cell and contact regions CR and WR. The peripheral insulating pattern 30 may be formed of, for example, a silicon oxide layer.

A peripheral etch stop layer 32 may be formed on the peripheral insulating pattern 30. The peripheral etch stop layer 32 may be formed of a material (e.g., silicon nitride) having an etch selectivity with respect to the peripheral insulating pattern 30.

A molding structure MS may be formed on the substrate 10 to cover the peripheral etch stop layer 32 and the peripheral insulating pattern 30 of the peripheral region PR. The molding structure MS may include sacrificial layers SC and insulating layers 111. The sacrificial layers SC and the insulating layers 111 may be alternatingly and repeatedly stacked on the substrate 10 in the vertical direction (e.g., the Z-direction). The sacrificial layers SC may include a material having an etch selectivity with respect to the insulating layers 111. For example, the sacrificial layers SC may include a silicon nitride layer, and the insulating layers 111 may include a silicon oxide layer.

Figure 9:
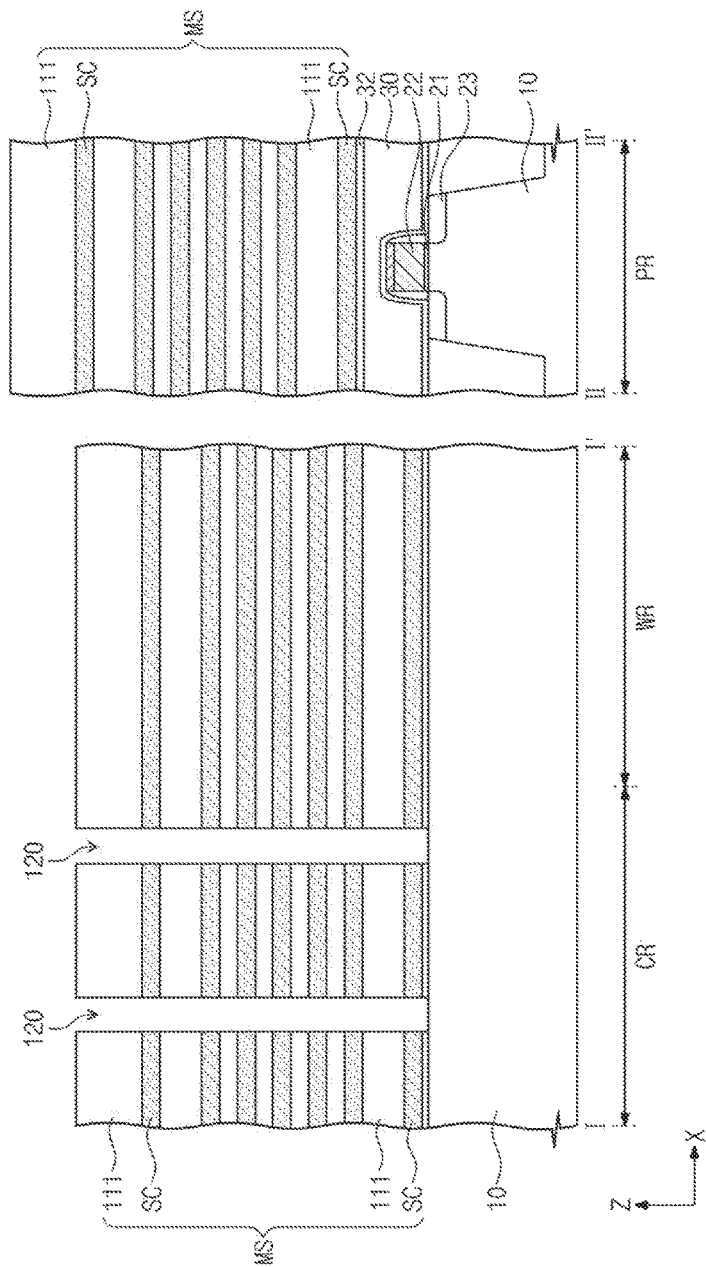

Referring to FIG. 9, the molding structure MS may be patterned to form channel holes 120 on the cell region CR. In detail, the formation of the channel holes 120 may include forming a mask pattern (not shown) on the molding structure MS and then sequentially etching the insulating layers 111 and the sacrificial layers SC using the mask pattern as an etch mask. Here, the mask pattern may be formed to cover the contact and peripheral regions WR and PR and to partially expose the cell region CR, and the patterning process of the molding structure MS may be performed to expose portions of the top surface of the substrate 10. The patterning process of the molding structure MS may be performed using an anisotropic etching method, and in this case, each of the channel holes 120 may be formed to have a uniform width (or diameter), regardless of a vertical distance from the substrate 10. In certain exemplary embodiments, each of the channel holes 120 may be formed to have a vertically-varying width. For example, each of the channel holes 120 may be formed to have an inclined side surface, resulting in a width that increases or decreases as the channel hole 120 extends in a direction away from the top surface of the substrate, or curved side surface, resulting in a width that increases and decreases as the channel hole 120 extends in a direction away from the top surface of the substrate. Furthermore, in the case where the patterning process of the molding structure MS is performed in an over-etching manner, the top surface of the substrate 10 may be partially recessed. When viewed in a plan view, each of the channel holes 120 may have a circular, elliptical, or polygonal shape. In some embodiments, each of the channel holes 120 may have a same shape.

Figure 10:
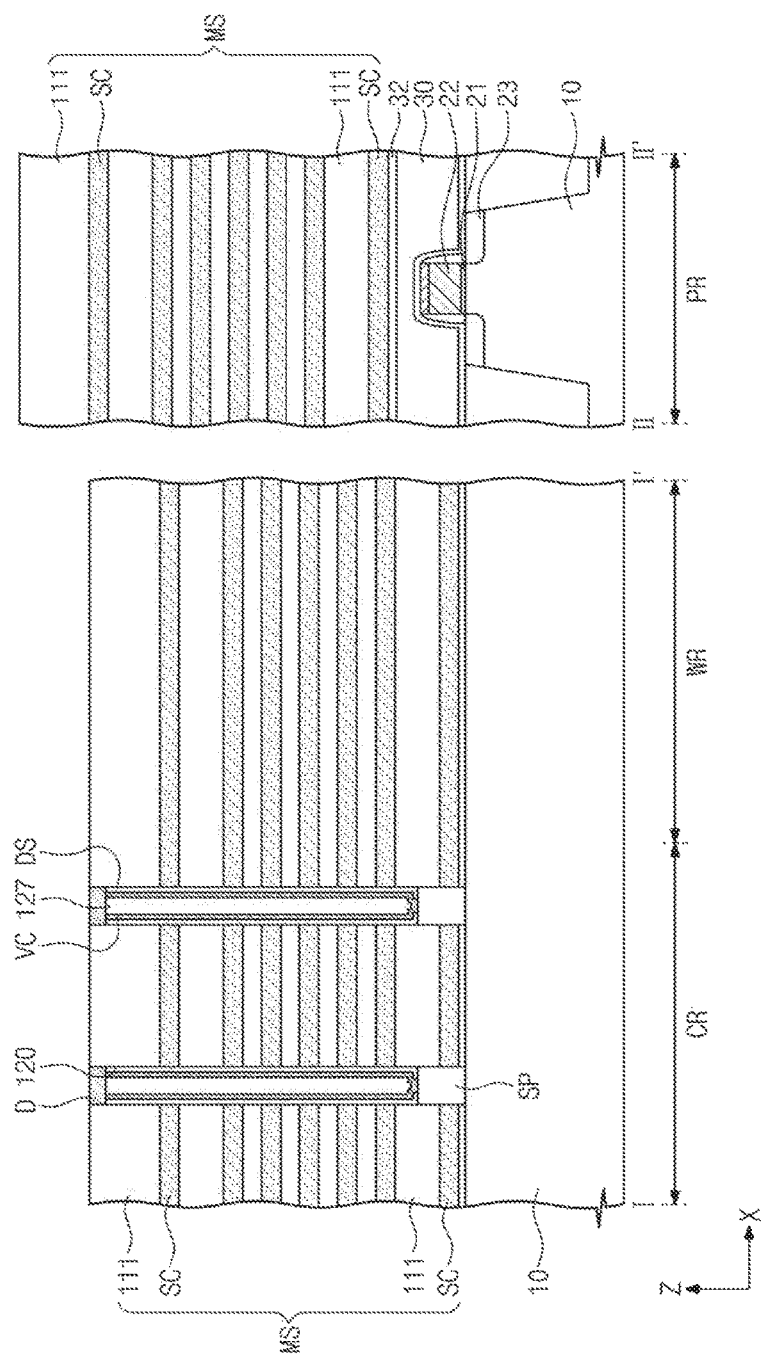

Referring to FIG. 10, semiconductor pillars SP may be formed on the top surface of the substrate 10 exposed by the channel holes 120. For example, the semiconductor pillars SP may be formed by a selective epitaxial growth process, in which the substrate 10 exposed by the channel holes 120 are used as a seed layer. The semiconductor pillars SP may be formed of an intrinsic or p-type semiconductor material.

A charge storing structure DS may be formed in the channel holes 120, in which the semiconductor pillars SP are formed. The charge storing structure DS may be conformally formed to cover side surfaces of the channel holes 120 and a portion of a top surface of the semiconductor pillar SP. The charge storing structure DS may be formed such that a first portion of the top surface of the semiconductor pillar SP is covered while a second portion of the top surface of the semiconductor pillar SP remains exposed. The charge storing structure DS may be formed by, for example, a chemical vapor deposition (CVD) process and/or an atomic layer deposition (ALD) process. For example, as shown in FIG. 3, the charge storing structure DS may include a blocking insulating layer BLL, a charge storing layer CTL, and a tunnel insulating layer TL, which are sequentially formed on the side surfaces of the channel holes 120 and the top surface of the semiconductor pillar SP. In some embodiments, the blocking insulating layer BLL may be formed of at least one of silicon oxide or high-k dielectric materials (e.g., $Al_2O_3$ and $HfO_2$), the charge storing layer CTL may be formed of silicon nitride, and the tunnel insulating layer TL may be formed of at least one of silicon oxynitride or high-k dielectric materials (e.g., $Al_2O_3$ and $HfO_2$).

A vertical channel portion VC may be formed in the channel hole 120 having the charge storing structure DS. In the channel hole 120, the vertical channel portion VC may be formed to conformally cover the charge storing structure DS and the portion of the top surface of the semiconductor pillar SP left exposed by the charge storing structure DS. The vertical channel portion VC may be formed of or may include a semiconductor material. For example, the vertical channel portion VC may be formed of or may include at least one of a poly silicon layer, an organic semiconductor layer, or carbon nano structures.

A capping layer 127 may be formed in the channel holes 120 having the vertical channel portion VC and the charge storing structure DS. The capping layer 127 may be formed to fill remaining spaces of the channel holes 120. The capping layer 127 may be formed by a spin-on-glass (SOG) process. The capping layer 127 may be formed of or may include an insulating material (e.g., silicon oxide, silicon nitride, etc.).

A pad D may be formed on the charge storing structure DS, the vertical channel portion VC, and the capping layer 127. For example, the pad D may be formed to fill an upper portion of the channel hole 120 and cover top surfaces of the charge storing structure DS, the vertical channel portion VC, and the capping layer 127. The formation of the pad D may include etching upper portions of the charge storing structure DS, the vertical channel portion VC, and the capping layer 127 to form a recess region and then filling the recess region with a conductive material. In certain embodiments, an ion implantation process may be performed on the upper portion of the vertical channel portion VC to form the pad D, whose conductivity type is different from the vertical channel portion VC.

Figure 11:
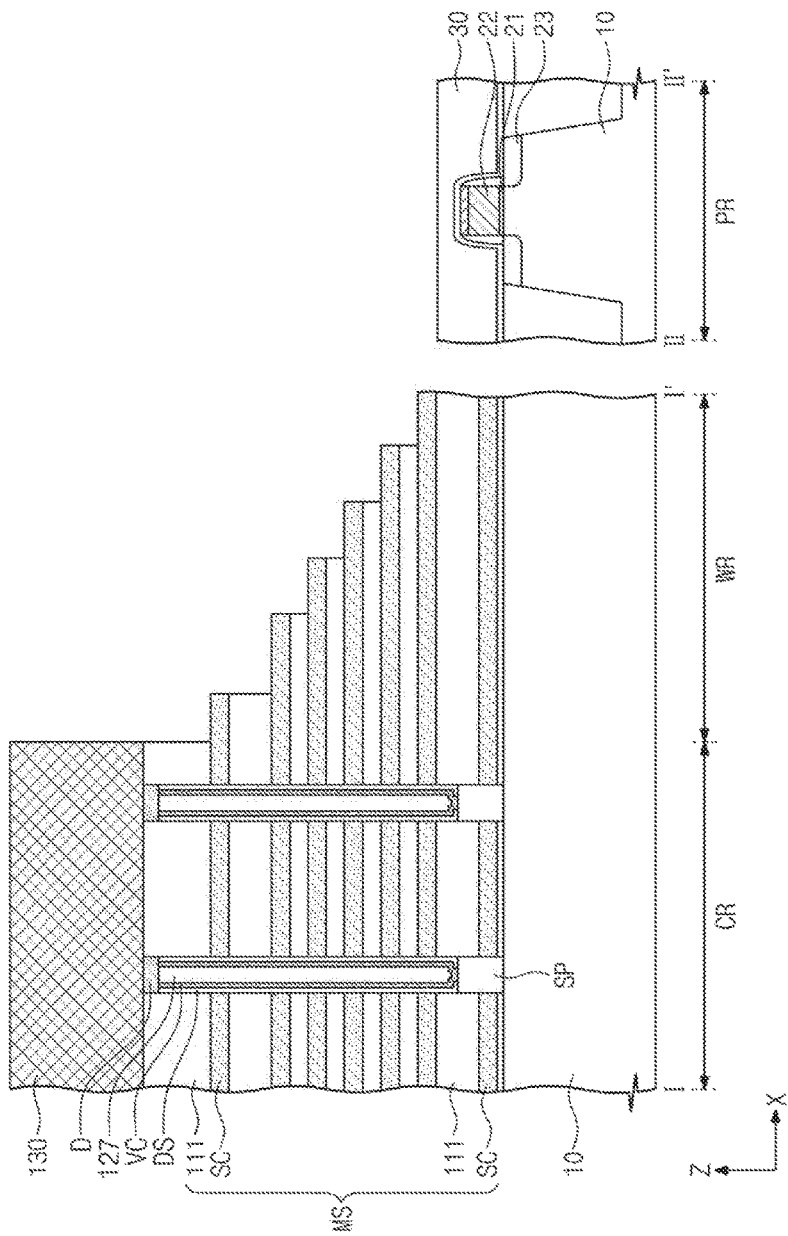

Referring to FIG. 11, a mask pattern 130 may be formed on the molding structure MS to cover the cell region CR and expose the contact and peripheral regions WR and PR. An etching process using the mask pattern 130 as an etch mask may be performed on the molding structure MS to remove all or portions of the molding structure MS from the contact and peripheral regions WR and PR. For example, on the peripheral region PR, the sacrificial layers SC and the insulating layers 111 may be removed and the top surface of the peripheral insulating pattern 30 may be exposed. In addition, during the etching process, the molding structure MS may be patterned to have a stepwise structure on the contact region WR.

The stepwise structure of the molding structure MS on the contact region WR may be formed by repeating process steps of reducing an occupying area of the mask pattern 130 and of etching the insulating and sacrificial layers 111 and SC using the mask pattern 130 as an etch mask.

In detail, first, the mask pattern 130 may be formed to cover the molding structure MS on the cell and contact regions CR and WR and expose the molding structure MS on the peripheral region PR. Thereafter, a peripheral etching process using the mask pattern 130 as an etch mask may be performed to remove the insulating and sacrificial layers 111 and SC from the peripheral region PR. For example, the peripheral etching process may be performed to expose the top surface of the peripheral insulating pattern 30, on the peripheral region PR.

Next, a contact etching process may be repeated to form the stepwise structure of the molding structure MS on the contact region WR. The contact etching process may include etching the mask pattern 130 to incrementally reduce an occupying area of the mask pattern 130 and anisotropically etching the insulating and sacrificial layers 111 and SC on the contact region WR using the incrementally reduced mask pattern 130 as an etch mask. An etching depth in each of the contact etching processes may be smaller than that in the peripheral etching process.

In some embodiments, the mask pattern 130 may be replaced with a new mask pattern 130 between the contact etching processes to incrementally reduce the area covered or occupied by the mask pattern 130. In certain embodiments, each of the contact etching processes may further include newly forming the mask pattern 130 and removing the mask pattern 130 after the anisotropic etching of the insulating and sacrificial layers 111 and SC. For each of the sacrificial and insulating layers SC and 111, the occupying or planar area, as measured in the X- and/or Y-directions, may decrease with increasing distance, as measured in the Z-direction, from the substrate 10.

Meanwhile, there may be a height difference between the molding structure MS on the cell and contact regions CR and WR and the structures on the peripheral region PR. For example, the top surface of the uppermost one of the insulating layers 111 on the cell region CR may be positioned at a higher vertical level than that of the peripheral insulating pattern 30 on the peripheral region PR.

Figure 12:
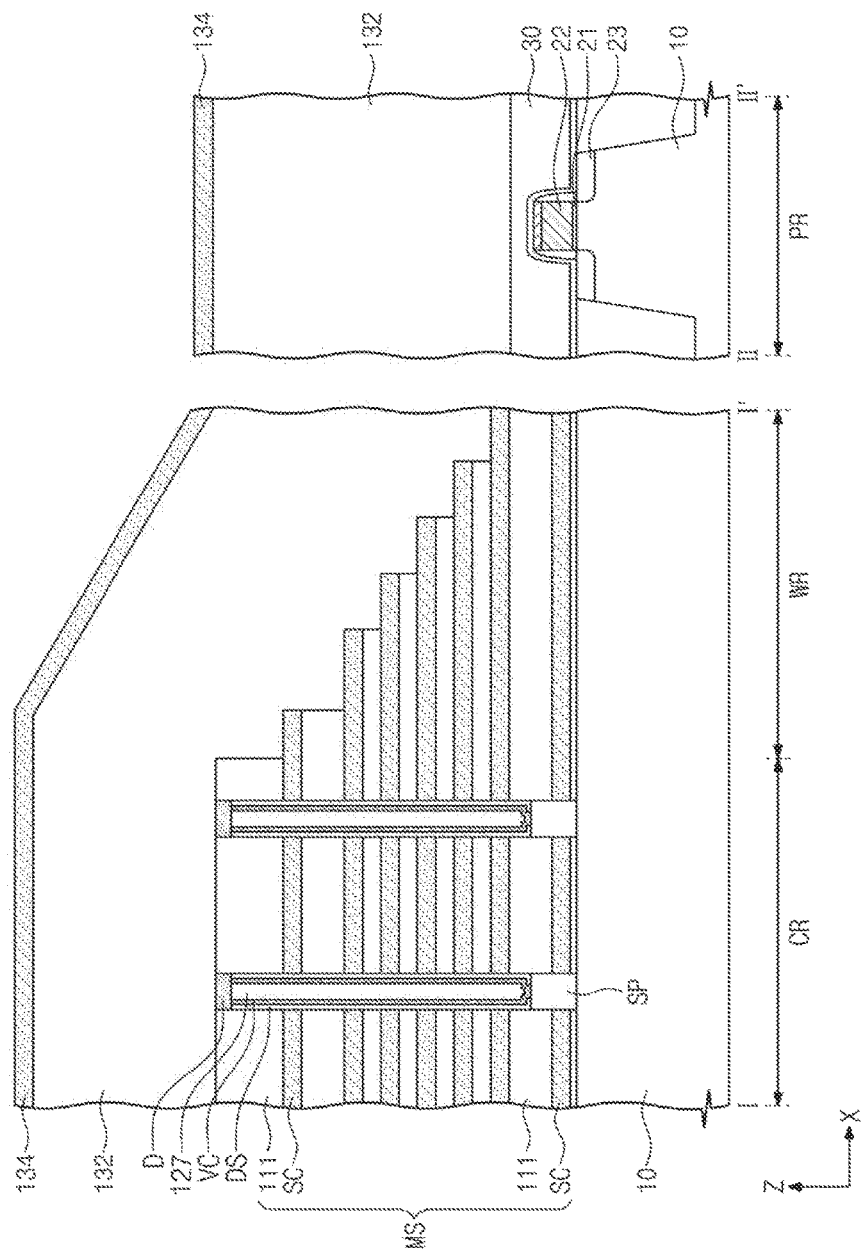

Referring to FIG. 12, a first interlayer insulating layer 132 may be formed on the substrate 10. The first interlayer insulating layer 132 may be formed to cover the molding structure MS on the cell and contact regions CR and WR and to cover the peripheral insulating pattern 30 on the peripheral region PR. Owing to the height difference between structures provided on the cell, contact, and peripheral regions CR, WR, and PR, the first interlayer insulating layer 132 may be formed to have a top surface that is non-level across the horizontal plane (e.g., a plane extending in the X- or Y-directions). For example, the top surface of the first interlayer insulating layer 132 may be higher on the cell region CR than on the contact region WR or the peripheral region PR, and the lowermost portion of the top surface of the first interlayer insulating layer 132 may be positioned on the peripheral region PR. Also, on the contact region WR, the top surface of the first interlayer insulating layer 132 may be gradually lowered in a direction from the cell region CR toward the peripheral region PR, thereby having an inclined profile. For example, a height of the top surface of the first interlayer insulating layer 132, as measured in the Z-direction, may decrease from a level of the top surface of the first interlayer insulating layer 132 at the cell region CR to a level of the top surface of the first interlayer insulating layer 132 at the peripheral region PR.

The first interlayer insulating layer 132 may be formed using a physical vapor deposition (PVD) method, a chemical vapor deposition (CVD) method, a sub-atmospheric CVD (SACVD) method, a low-pressure CVD (LPCVD) method, a plasma-enhanced CVD (PECVD) method, or a high-density plasma CVD (HDP CVD) method.

The first interlayer insulating layer 132 may be formed of a material having an etch selectivity with respect to the sacrificial layers SC. For example, the first interlayer insulating layer 132 may be formed of at least one of high density plasma (HDP) oxide, tetraethylorthosilicate (TEOS), plasma-enhanced TEOS (PE-TEOS), O3-TEOS, undoped silicate glass (USG), phosphosilicate glass (PSG), borosilicate glass (BSG), borophosphosilicate glass (BPSG), fluoride silicate glass (FSG), spin on glass (SOG), or tonen silazene (TOSZ). In certain exemplary embodiments, the first interlayer insulating layer 132 may be formed of or may include at least one of silicon nitride, silicon oxynitride, or low-k dielectric materials.

A polishing stop layer 134 may be formed on the first interlayer insulating layer 132. The polishing stop layer 134 may be used as a sacrificial layer for preventing dishing phenomenon from occurring in the first interlayer insulating layer 132 formed on the contact and peripheral regions WR and PR, when a chemical mechanical polishing process is performed on the first interlayer insulating layer 132. The polishing stop layer 134 may be formed conformally on the first interlayer insulating layer 132 such that a height of the top surface of the polishing stop layer 134, as measured in the Z-direction, decreases from a level of the top surface of the polishing stop layer 134 at the cell region CR to a level of the top surface of the polishing stop layer 134 at the peripheral region PR.

The polishing stop layer 134 may be formed of a material whose etch rate is lower than that of the first interlayer insulating layer 132 when the chemical mechanical polishing process is performed. For example, the polishing stop layer 134 may be formed of or may include at least one selected from the group consisting of silicon nitride (SiN), silicon oxynitride (SiON), silicon carbide (SiC), silicon oxycarbide (SiOC), conductive materials, SiLK, black diamond, CORAL, BN, or anti-reflective coating (ARC) materials.

Figure 13:
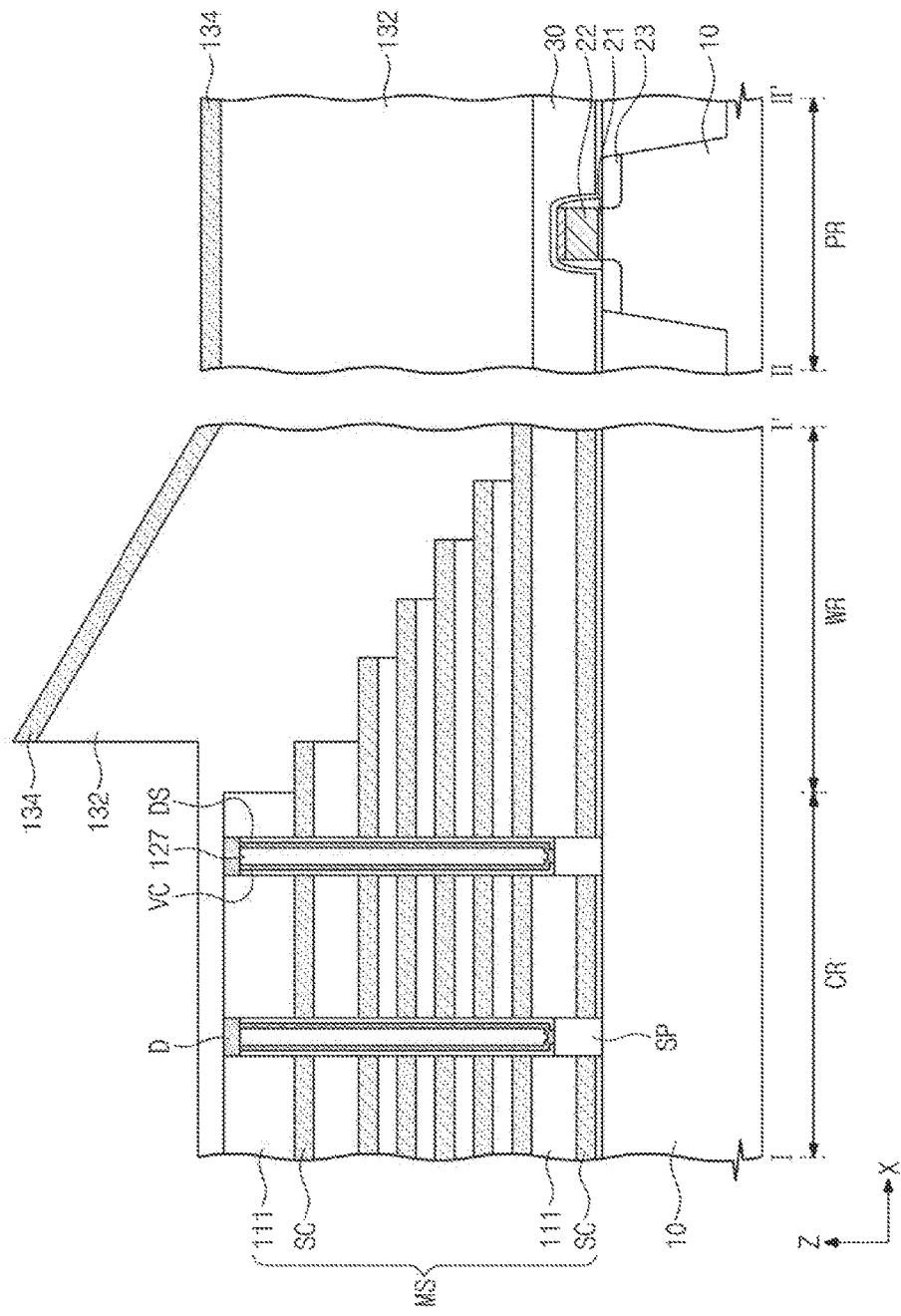

Referring to FIG. 13, a portion of the first interlayer insulating layer 132 may be etched from the cell region CR to reduce the difference in the height of the top surface of the first interlayer insulating layer 132 between the cell, contact, and peripheral regions CR, WR, and PR. For example, a photoresist pattern (not shown) may be formed on the polishing stop layer 134 to expose the cell region CR, and the polishing stop layer 134 and the first interlayer insulating layer 132 may be etched using the photoresist pattern as an etch mask. As a result, the first interlayer insulating layer 132 may have a protruding portion on the contact region WR near the cell region CR. The protruding portion of the first interlayer insulating layer 132 may have an upward protruding shape, compared with other portions of the first interlayer insulating layer 132 positioned on the cell and peripheral regions CR and PR. For example, the protruding portion may have a triangular shape, wherein one side of the protruding portion is perpendicular to the top surface of the cell region CR and the top surface of the protruding portion is formed at an acute angle relative to the top surface of the cell region CR and an obtuse angle relative to the top surface of the peripheral region PR.

Figure 14:
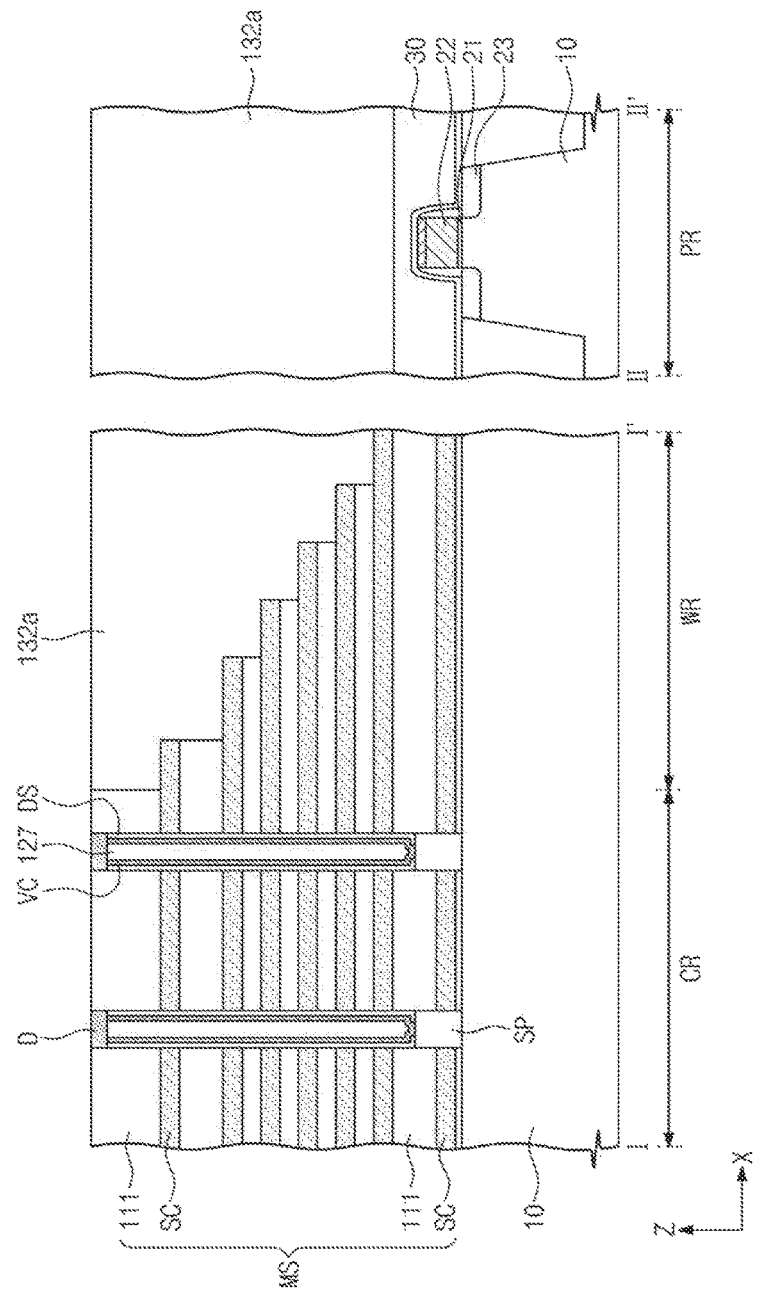

Referring to FIG. 14, a planarization process may be performed on the first interlayer insulating layer 132 to form a first interlayer insulating pattern 132a. The planarization process may be performed to expose the top surface of the uppermost one of the insulating layers 111. For example, the first interlayer insulating pattern 132a may be locally formed on the contact and peripheral regions WR and PR.

During the planarization process, the polishing stop layer 134 may be removed from the contact region WR while remaining on the peripheral region PR. After the planarization process, the remaining portion of the polishing stop layer 134 on the peripheral region PR may be selectively removed to expose the top surface of the first interlayer insulating pattern 132a on the peripheral region PR.

Figure 15:
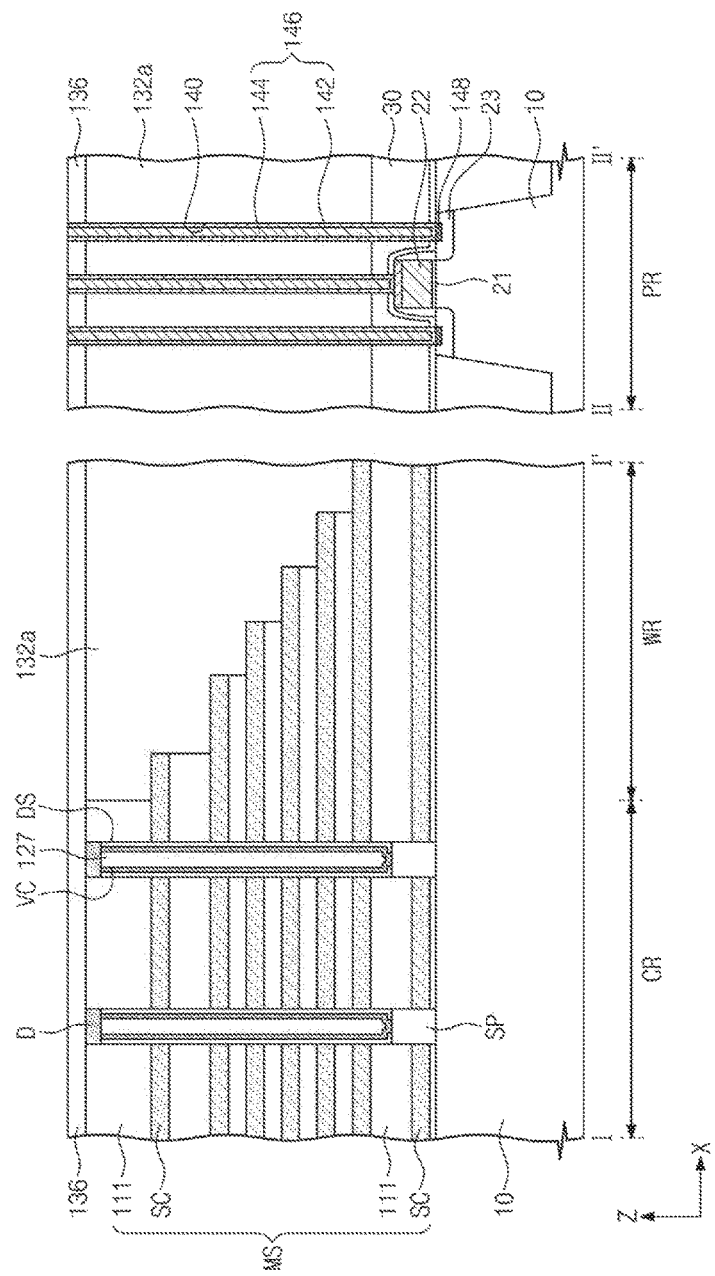

Referring to FIG. 15, a second interlayer insulating layer 136 may be formed to cover the top surface of the molding structure MS on the cell region CR and the top surface of the first interlayer insulating pattern 132a on the contact and peripheral regions WR and PR. The second interlayer insulating layer 136 may be formed of or may include at least one of silicon oxide or silicon nitride.

The second interlayer insulating layer 136, the first interlayer insulating pattern 132a, and the peripheral insulating pattern 30 on the peripheral region PR may be patterned to form peripheral contact holes 140. The patterning process may be performed using an anisotropic etching method to expose the top surfaces of the peripheral impurity regions 23 and the peripheral gate pattern 22.

A first metal layer 142 may be formed to conformally cover inner surfaces of the peripheral contact holes 140. For example, in the peripheral contact holes 140 exposing the peripheral impurity regions 23, the first metal layer 142 may be formed to conformally cover side surfaces of the peripheral contact holes 140 and the top surfaces of the peripheral impurity regions 23. Also, in the peripheral contact hole 140 exposing the peripheral gate pattern 22, the first metal layer 142 may be formed to conformally cover the side surfaces of the peripheral contact holes 140 and the top surface of the peripheral gate pattern 22. The first metal layer 142 may be formed of or may include at least one of cobalt (Co), titanium (Ti), nickel (Ni), or tungsten (W).

A thermal treatment process may be performed on the substrate 10 provided with the first metal layer 142 to form silicide layers 148 on the peripheral impurity regions 23. As a result of the thermal treatment process, defects in the peripheral impurity regions 23 may be cured. In some embodiments, the thermal treatment process may be performed at a process temperature of about 700° C. or higher in a rapid thermal annealing manner. Metallic elements in the first metal layer 142 may be diffused into the substrate 10 during the thermal treatment process, and the silicide layer 148 may be formed as a result of a chemical reaction between the diffused metallic elements and silicon (Si) atoms in the substrate 10. In the case where the first metal layer 142 contains titanium (Ti), the silicide layer 148 may include a titanium silicide layer (TiSi$_x$). The formation of the silicide layer 148 may make it possible to improve surface stability of the peripheral impurity regions 23 and to reduce a contact (or interface) resistance between a contact plug thereon and the peripheral impurity region 23. For example, the silicide layer 148 may serve as an ohmic contact layer by forming a lower resistance junction that provides for current conduction between the peripheral impurity regions 23 and the peripheral contact 146.

When the thermal treatment process is finished, a second metal layer 144 may be formed in the peripheral contact holes 140. The second metal layer 144 may be formed to completely fill the remaining spaces of the peripheral contact holes 140 in which the first metal layer 142 have been formed. The second metal layer 144 may include at least one layer. For example, the second metal layer 144 may be formed of or may include at least one of metals (e.g., tungsten, copper, aluminum, etc.) or conductive metal nitrides (e.g., titanium nitride, tantalum nitride, etc.). In some embodiments, the first metal layer 142 and the second metal layer 144 may constitute a peripheral contact 146.

Figure 16:
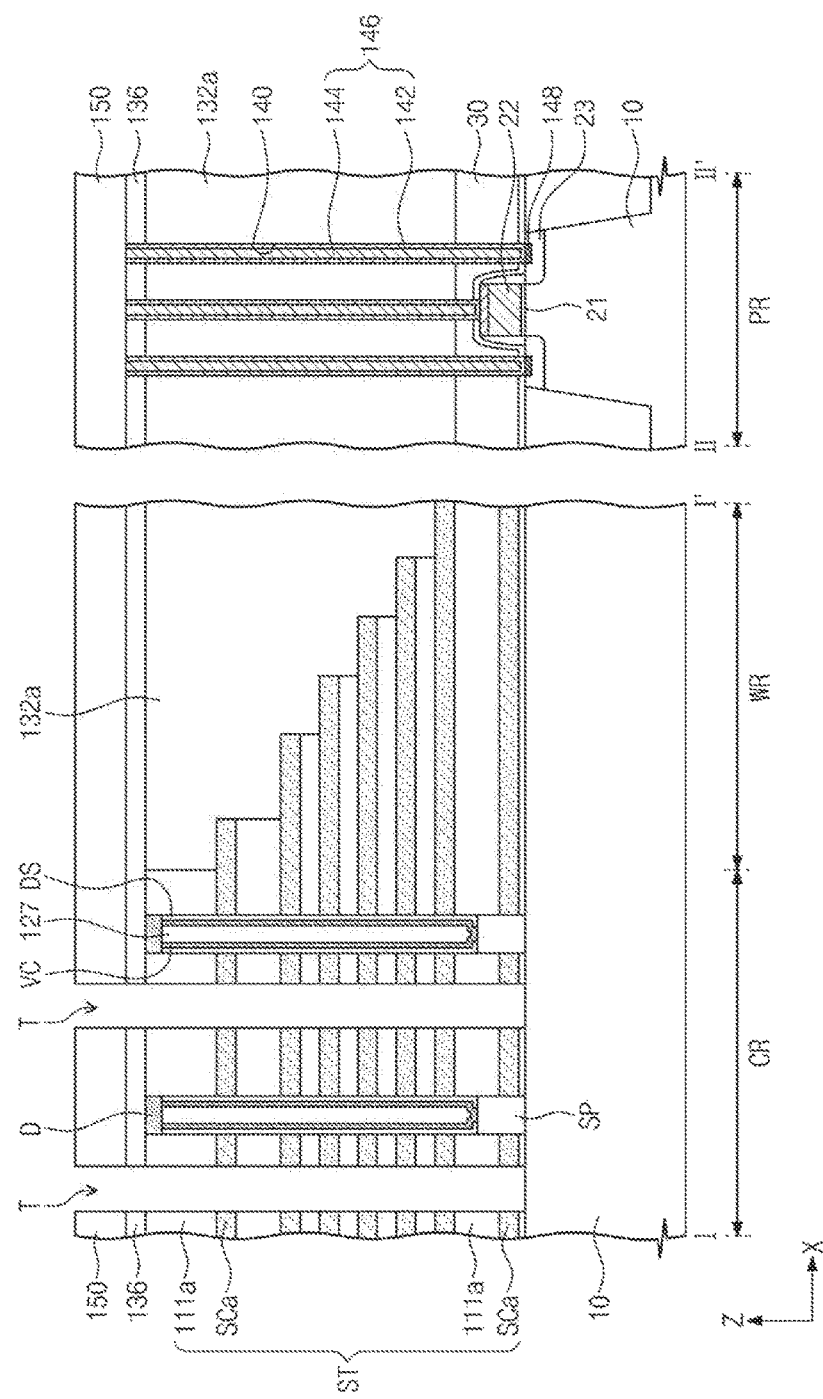

Referring to FIG. 16, a third interlayer insulating layer 150 may be formed on the second interlayer insulating layer 136. The third interlayer insulating layer 150 may be formed to cover the top surfaces of the peripheral contacts 146 and the top surface of the second interlayer insulating layer 136. The third interlayer insulating layer 150 may be formed of or may include at least one of, for example, silicon oxide or silicon nitride.

Common source trenches T may be formed by patterning the molding structure MS using the third interlayer insulating layer 150 as an etch mask. The common source trenches T may be formed by performing an anisotropic etching process on the molding structure MS and may be formed to expose the top surface of the substrate 10. When viewed in a plan view, each of the common source trenches T may be formed to have a rectangular or linear shape extending lengthwise in a second direction (e.g., the Y-direction) perpendicular to the first direction (e.g., the X-direction).

As a result of the formation of the common source trenches T, the molding structure MS may be divided into a plurality of stacks ST spaced apart from each other in a first direction (e.g., the X-direction). Each of the stacks ST may include insulating patterns 111a and sacrificial patterns SCa alternatingly stacked on the substrate 10. Each of the common source trenches T may be formed to expose side surfaces of the insulating and sacrificial patterns 111a and SCa.

Figure 17:
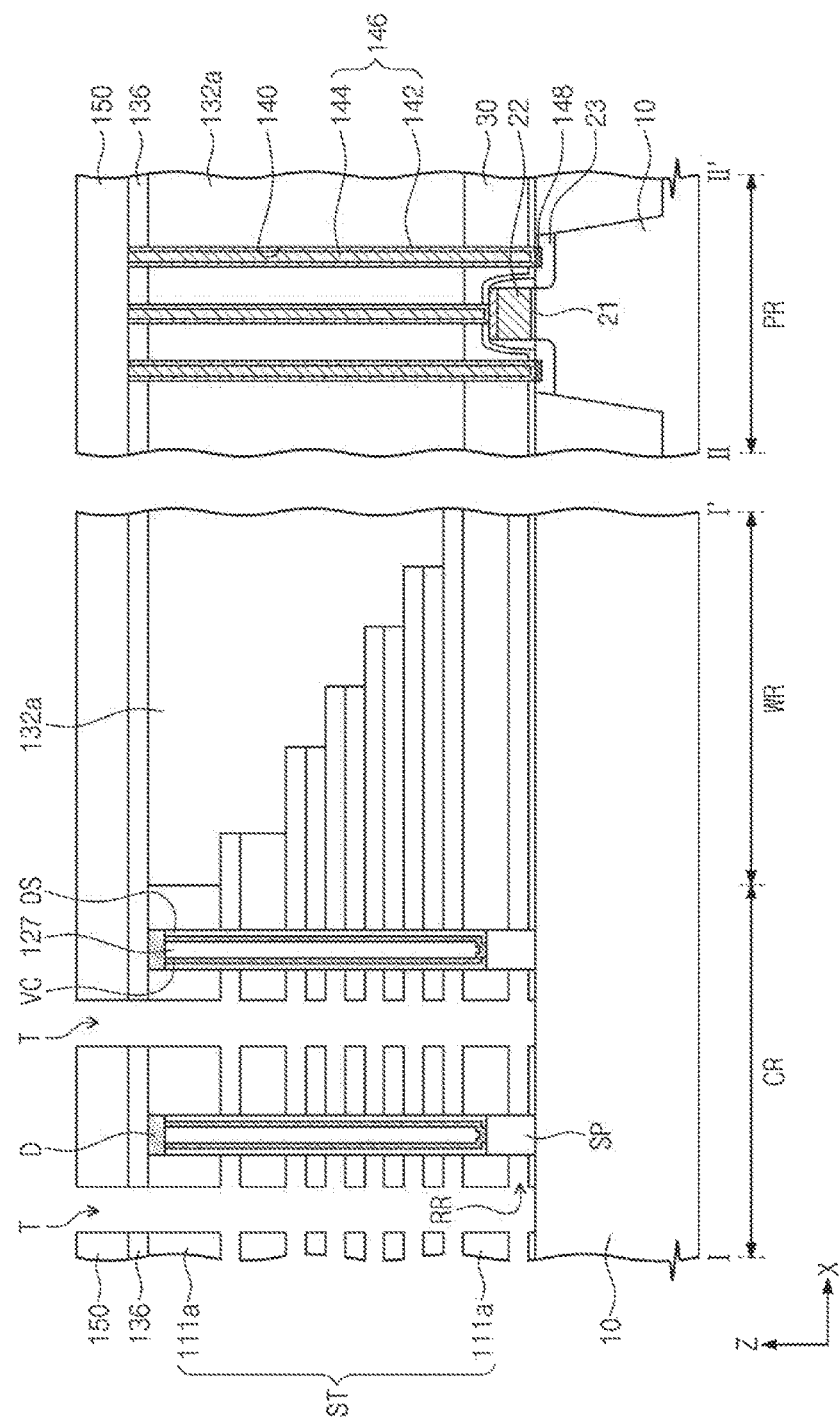

Referring to FIG. 17, the sacrificial patterns SCa exposed by the common source trenches T may be selectively removed to form recess regions RR between the stacked insulating patterns 111a. The removal of the sacrificial patterns SCa may be performed using an etching recipe, which is selected to etch the sacrificial patterns SCa at a high etch rate and the insulating patterns 111a at an extremely low etch rate. The removal of the sacrificial patterns SCa may be performed using a wet etching process and/or an isotropic dry etching process. For example, in the case where the sacrificial patterns SCa are formed of silicon nitride and the insulating patterns 111a are formed of silicon oxide, the removal of the sacrificial patterns SCa may be performed using an etching solution containing phosphoric acid.

The recess regions RR may be formed between the insulating patterns 111a and may be vertically spaced apart from each other by the insulating patterns 111a. For example, each of the recess regions RR may be a gap region that is laterally extended from the common source trench T and is positioned between the insulating patterns 111a. For example, he recess regions RR may laterally extend from the common source trench T in the X- and/or Y-directions. In some embodiments, each of the recess regions RR may be formed to expose top and bottom surfaces of the insulating patterns 111a, a portion of an outer side surface of the charge storing structure DS, and a portion of a side surface of the semiconductor pillar SP.

Figure 18:
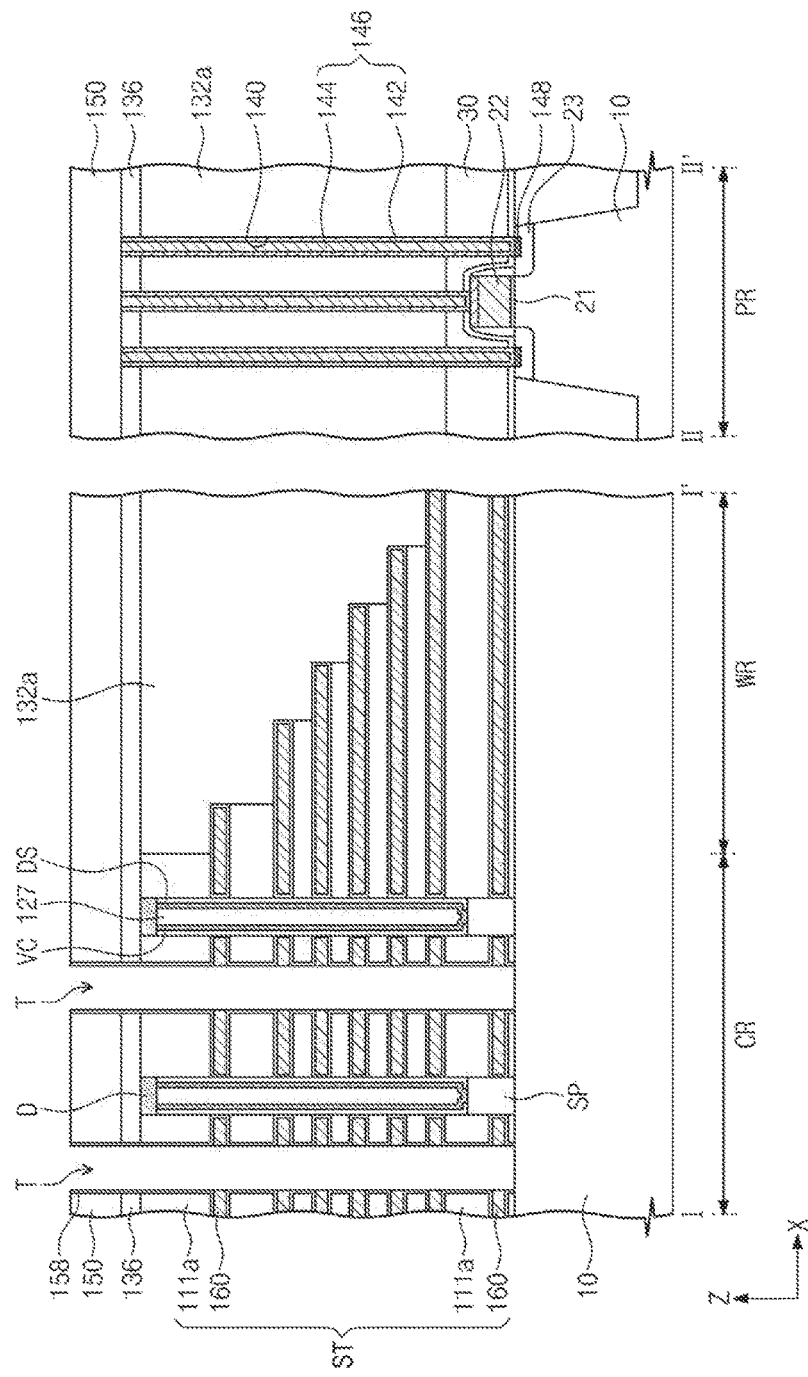

Referring to FIG. 18, a horizontal insulating layer 158 may be formed to conformally cover inner surfaces of the recess regions RR. For example, the horizontal insulating layer 158 may be formed to conformally cover the top, bottom and side surfaces of the insulating patterns 111a, the exposed portions of the outer side surface of the charge storing structure DS, and the exposed portion of the side surface of the semiconductor pillar SP. The horizontal insulating layer 158 may be formed by a deposition method with a good step coverage property. For example, the horizontal insulating layer 158 may be formed by a chemical vapor deposition (CVD) process or an atomic layer deposition (ALD) process. The horizontal insulating layer 158 may be formed of or may include at least one of high-k dielectric materials (e.g., aluminum oxide, hafnium oxide, zirconium oxide, hafnium aluminum oxide, and hafnium silicon oxide).

Gate electrodes 160 may be formed by filling the recess regions RR with a conductive material. The formation of the gate electrodes 160 may include forming a conductive layer to fill the recess regions RR and then removing the conductive layer from the common source trenches T leaving the conductive layer in the recess regions RR. The process of removing the conductive layer from the common source trenches T may be performed using an anisotropic etching process. The gate electrodes 160 may be formed of or may include a conductive material. For example, the gate electrodes 160 may be formed of or may include at least one of doped silicon, metals (e.g., tungsten, copper, aluminum, etc.), conductive metal nitrides (e.g., titanium nitride, tantalum nitride, etc.), or transition metals (e.g., titanium, tantalum, etc.).

Typically, a thermal treatment temperature may be performed at a process temperature of 700° C. or higher to form the silicide layer 148, and the peripheral contact 146 may be formed after the formation of the gate electrodes 160. A fluorine-containing gas (e.g., $WF_6$ gas) may be used to form the gate electrodes 160, and a part of the fluorine-containing gas may remain in the gate electrodes 160, even when the formation of the gate electrodes 160 is finished. The thermal treatment process for forming the silicide layer 148 may lead to diffusion of fluorine (F) ions from the gate electrodes 160 into the blocking insulating layer BLL through the horizontal insulating layer 158, and such diffused fluorine (F) ions may result in deterioration of the blocking insulating layer BLL.

According to some exemplary embodiments, the process of forming the peripheral contact 146 may be performed before the formation of the gate electrodes 160. For example, the thermal treatment process at the temperature of 700° C. or higher to form the peripheral contact 146 may be performed before the formation of the gate electrodes 160. Also, subsequent thermal processes, which may be performed after the formation of the gate electrodes 160, may be performed under a temperature condition of 700° C. or lower. Accordingly, it is possible to prevent the fluorine (F) ions from being diffused from the gate electrodes 160 to the blocking insulating layer BLL and to prevent the blocking insulating layer BLL from being damaged by the fluorine (F) ions.

Figure 19:
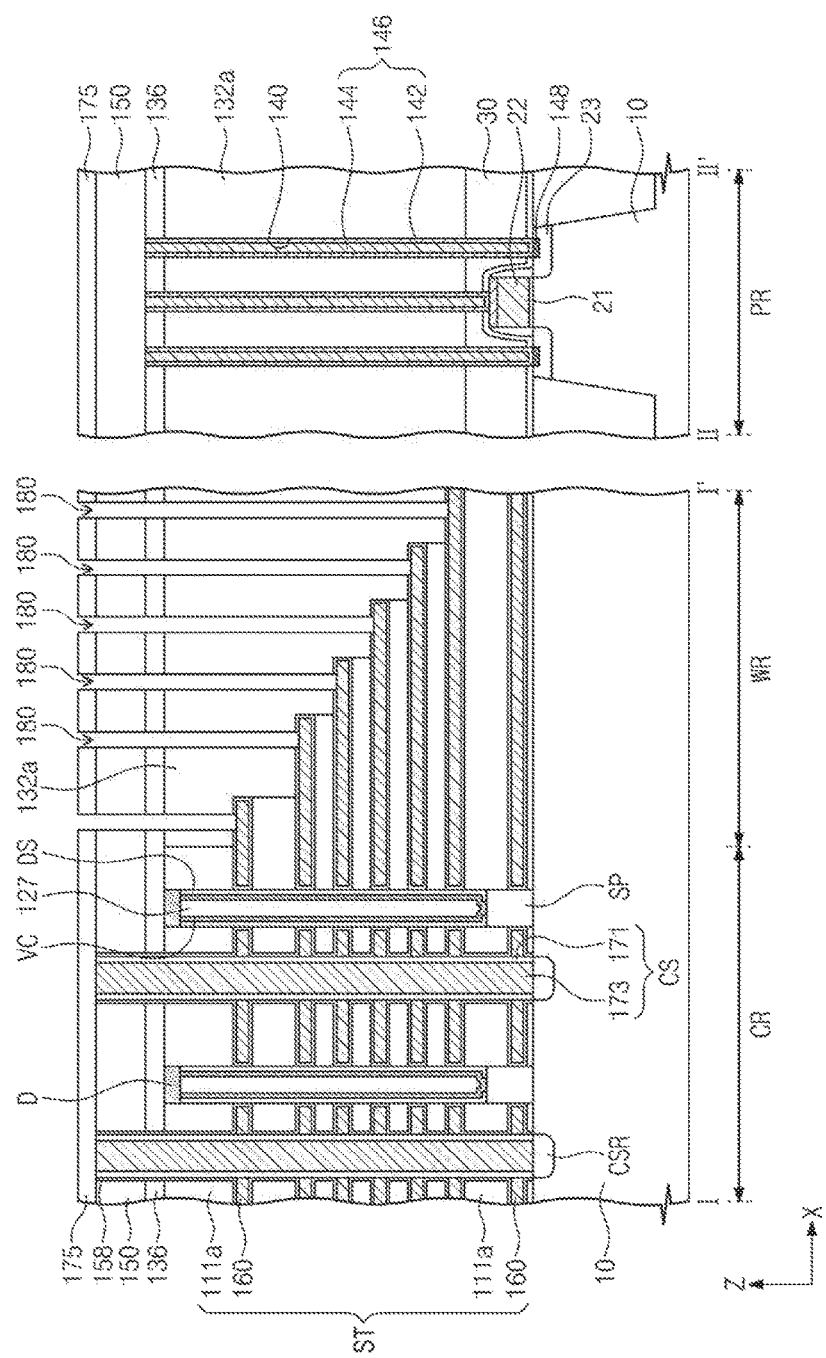

Referring to FIG. 19, cell impurity regions CSR may be formed in the substrate 10 exposed by the common source trenches T. The cell impurity region CSR may be formed by performing an ion implantation process on the substrate 10 in the cell region CR. The cell impurity region CSR may be doped to have a conductivity type different from the substrate 10.

The contact structure CS may be formed in each of the common source trenches T. The contact structure CS may include a spacer 171 and a common source contact 173. The spacer 171 may be formed to cover a side surface of the common source trench T. The formation of the spacer 171 may include forming an insulating layer (not shown) to cover side and bottom surfaces of the common source trench T and removing the insulating layer from the bottom surface of the common source trench T. The spacer 171 may be formed of or may include at least one of, for example, silicon oxide or silicon nitride.

The common source contact 173 may be formed to fill the remaining space of the common source trench T provided with the spacer 171. The common source contact 173 may be formed using one of CVD, PVD, and ALD processes. The common source contact 173 may be formed of or may include at least one of metals (e.g., tungsten, copper, aluminum, etc.), conductive metal nitrides (e.g., titanium nitride, tantalum nitride, etc.), or transition metals (e.g., titanium, tantalum, etc.).

A fourth interlayer insulating layer 175 may be formed on the third interlayer insulating layer 150. The fourth interlayer insulating layer 175 may be formed to cover the top surface of the contact structure CS and the top surface of the third interlayer insulating layer 150. The fourth interlayer insulating layer 175 may be formed of or may include at least one of, for example, silicon oxide or silicon nitride.

A patterning process using the fourth interlayer insulating layer 175 as an etch mask may be performed to form cell contact holes 180 on the contact region WR. Each of the cell contact holes 180 may be formed to penetrate the third, second, and first interlayer insulating layer 150, 136, and 132a, and the horizontal insulating layer 158 and to expose an end portion of a corresponding one of the gate electrodes 160.

Since the gate electrodes 160 are vertically stacked on the top surface of the substrate 10, end portions of the gate electrodes 160 may have different vertical positions. For example, top surfaces of the end portions of the gate electrodes 160 may be located at different heights relative to the top surface of the substrate 10 (e.g., in the Z-direction). Accordingly, process times taken to form the cell contact holes 180 may be different depending on the vertical positions of the end portions of the gate electrodes 160. For example, the end portion of the uppermost one of the gate electrodes 160 may be firstly exposed by the cell contact hole 180 before the others of the cell contact holes 180, and the end portion of the lowermost one of the gate electrodes 160 may be lastly exposed by the cell contact hole 180.

The gate electrodes 160 may include a material having an etch selectivity with respect to the insulating layers thereon, and thus, the gate electrodes 160 may be used as an etch stop layer, when the etching process is performed to form the cell contact holes 180.

Figure 20:
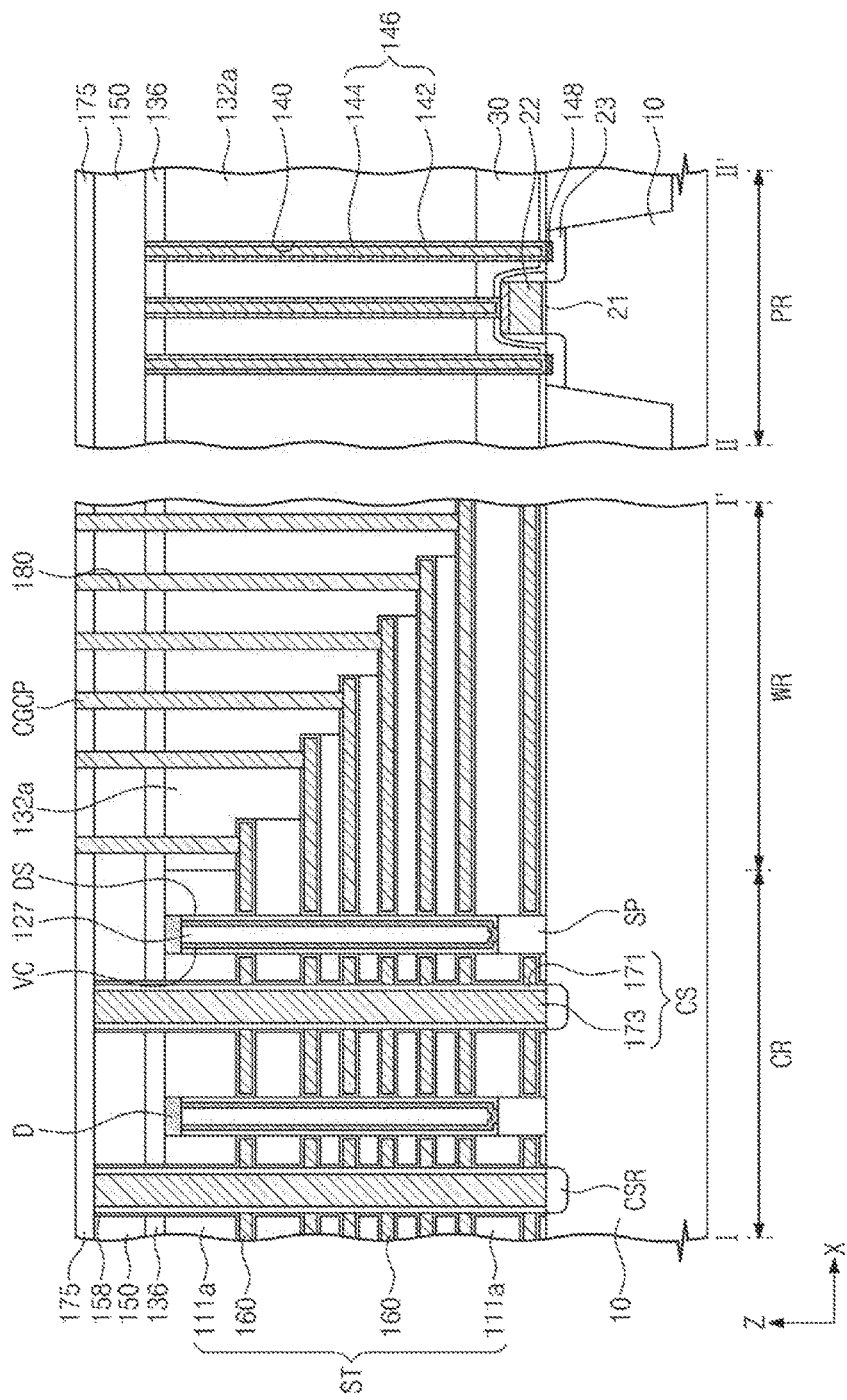

Referring to FIG. 20, cell contact plugs CGCP may be formed in the cell contact holes 180, respectively. The formation of the cell contact plugs CGCP may include forming a conductive layer (not shown) on the fourth interlayer insulating layer 175 to fill the cell contact holes 180 and etching the conductive layer to expose the top surface of the fourth interlayer insulating layer 175, and thus, the cell contact plugs CGCP may be locally formed in the cell contact holes 180, respectively. In some embodiments, the process of etching the conductive layer may be performed using an etch-back process or a chemical mechanical polishing process. The cell contact plugs CGCP may be formed of or may include at least one of metals (e.g., tungsten, copper, aluminum, etc.), conductive metal nitrides (e.g., titanium nitride, tantalum nitride, etc.), or transition metals (e.g., titanium, tantalum, etc.).

Figure 21:
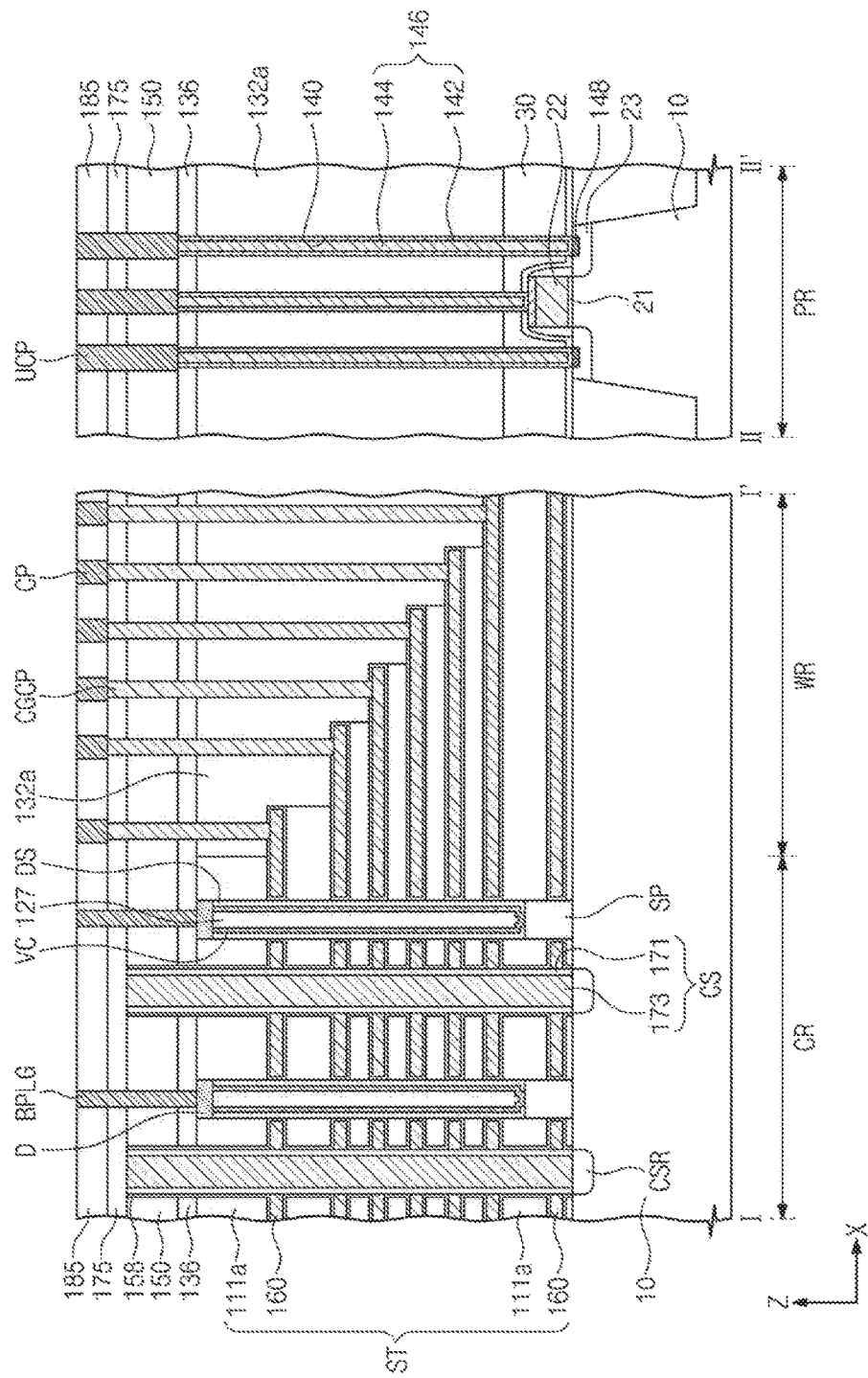

Referring to FIG. 21, a fifth interlayer insulating layer 185 may be formed on the fourth interlayer insulating layer 175. The fifth interlayer insulating layer 185 may be formed to cover the top surface of the fourth interlayer insulating layer 175 and the top surfaces of the cell contact plugs CGCP. The fifth interlayer insulating layer 185 may be formed of or may include at least one of, for example, silicon oxide or silicon nitride.

Bit line contact plugs BPLG may be formed on the cell region CR, contacts CP may be formed on the contact region WR, and peripheral contact plugs UCP may be formed on the peripheral region PR. The bit line contact plugs BPLG may be formed to penetrate the second, the third, the fourth, and the fifth interlayer insulating layers 136, 150, 175, and 185, and each of the bit line contact plugs BPLG may be connected to a respective one of the pads D. The contacts CP may be formed to penetrate the fifth interlayer insulating layer 185, and each of the contacts CP may be connected to a respective one of the contact plugs CGCP. The peripheral contact plugs UCP may be formed to penetrate the third, the fourth and the fifth interlayer insulating layers 150, 175, and 185, and each of the peripheral contact plugs UCP may be connected to a respective one of the peripheral contacts 146. The bit line contact plugs BPLG, the contacts CP, and the peripheral contact plug UCP may be formed of or include at least one of metallic materials (e.g., tungsten).

Referring back to FIG. 3, bit lines BL, connection lines CL, and a peripheral circuit line PCL may be formed on the fifth interlayer insulating layer 185. The bit lines BL, the connection lines CL, and the peripheral circuit line PCL may be formed by depositing a conductive layer on the fifth interlayer insulating layer 185 and patterning the conductive layer.

For example, as shown in FIG. 2, the bit lines BL may be formed to cross the stacks ST and extend in the second direction (e.g., the Y-direction), and each of the bit lines BL may be electrically connected to a plurality of the bit line contact plugs BPLG. Although not illustrated in the drawings, each of the connection lines CL may be electrically connected to at least one of the contacts CP arranged in the first direction X. As shown in FIG. 2, the peripheral circuit line PCL may extend from the cell region CR to the peripheral region PR. In some embodiments, memory cells of the cell region CR may be electrically connected to peripheral circuits of the peripheral region PR through the peripheral circuit lines PCL.

According to some exemplary embodiments, a method of fabricating a semiconductor memory device may include forming peripheral contacts on a peripheral region of a substrate and then forming cell gate electrodes on a cell region. Accordingly, it is possible to prevent fluorine from being diffused from the cell gate electrodes into a blocking insulating layer and consequently to prevent the blocking insulating layer from being damaged by fluorine.

While example embodiments have been particularly shown and described, it will be understood by one of ordinary skill in the art that variations in form and detail may be made therein without departing from the spirit and scope of the attached claims.

What is claimed is:

1. A semiconductor memory device, comprising: a substrate comprising a cell region and a peripheral region;
a stack provided on the cell region, the stack comprising gate electrodes stacked on the substrate;
vertical channel portions vertically penetrating the stack;
a contact structure penetrating the stack, the contact structure being spaced apart from the vertical channel portions;
an insulating structure provided on the peripheral region;
an impurity region formed in the peripheral region of the substrate; and a first contact penetrating the insulating structure, the first contact being connected to the impurity region,
wherein a top surface of the first contact is positioned at a lower level than a top surface of the contact structure,
wherein the top surface of the first contact is coplanar with a top surface of a first insulating layer, the first insulating layer being provided on a top surface of the vertical channel portions, and
wherein the top surface of the contact structure is coplanar with a top surface of a second insulating layer, the second insulating layer being provided on the first insulating layer.

2. The device of claim 1, further comprising:
a conductive pad provided on each of the vertical channel portions,
wherein a top surface of the conductive pad is positioned at a lower level than the top surface of the first contact.

3. The device of claim 1,
wherein the second insulating layer is provided to expose the top surface of the contact structure and cover the top surface of the first contact.

4. The device of claim 1, wherein the substrate further comprises a contact region provided around the cell region,
wherein each of the gate electrodes is extended to have a portion located on the contact region,
wherein the device further comprises a second contact provided on the contact region and connected to an end portion of a corresponding one of the gate electrodes, and
wherein a top surface of the second contact is positioned at a different level than the top surface of the first contact.

5. The device of claim 4, wherein the top surface of the second contact is positioned at a higher level than the top surface of the first contact.

6. The device of claim 4, wherein the top surface of the second contact is positioned at a higher level than the top surface of the contact structure.

7. The device of claim 4, further comprising:
a first contact plug provided on and electrically connected to the first contact; and
a second contact plug provided on and electrically connected to the second contact,
wherein a top surface of the first contact plug and a top surface of the second contact plug are positioned at substantially the same level.

8. The device of claim 1, further comprising:
a silicide layer provided in the impurity region and between the first contact and the substrate.

9. A semiconductor memory device, comprising:
a substrate including a cell region, a peripheral region, and a contact region formed around the cell region;
a stack provided on the cell region and the contact region, the stack comprising gate electrodes stacked on the substrate;

a vertical channel portion provided on the cell region to vertically penetrate the stack;

a first contact provided on the contact region and connected to an end portion of a corresponding one of the gate electrodes;

an insulating structure provided on the peripheral region; an impurity region formed in the peripheral region of the substrate; and a second contact penetrating the insulating structure on the peripheral region, the second contact being connected to the impurity region, wherein a top surface of the second contact is positioned at a different level from a top surface of the first contact, wherein the top surface of the second contact is coplanar with a top surface of a first insulating layer, the first insulating layer being provided on a top surface of the vertical channel portion, and wherein the top surface of the first contact is coplanar with a top surface of a second insulating layer, the second insulating layer being provided on the first insulating layer.

10. The device of claim 9, wherein the top surface of the second contact is positioned at a lower level than the top surface of the first contact.

11. The device of claim 10, further comprising:

a conductive pad provided on the vertical channel portion, wherein a top surface of the conductive pad is positioned at a lower level than the top surface of the second contact.

12. The device of claim 9, further comprising:

a contact structure provided on the substrate dividing the stack into a plurality of parts spaced apart from each other in a horizontal direction, wherein a top surface of the contact structure is positioned at a different level from the top surface of the first contact and a top surface of the second contact.

13. The device of claim 12, wherein the top surface of the second contact is positioned at a lower level than the top surface of the first contact and the top surface of the contact structure.

14. The device of claim 12, wherein the top surface of the second contact is positioned at a lower level than the top surface of the contact structure, the top surface of the contact structure is positioned at a lower level than the top surface of the first contact, and the top surface of the first contact is positioned at a higher level than the top surface of the second contact and the top surface of the contact structure.

15. The device of claim 9, further comprising:

a first contact plug provided on and electrically connected to the first contact; and a second contact plug provided on and electrically connected to the second contact, wherein a top surface of the first contact plug and a top surface of the second contact plug are positioned at substantially the same level.

16. A semiconductor memory device, comprising: a substrate including a cell region, a peripheral region, and a contact region formed around the cell region;

a stack provided on the cell region and the contact region, the stack comprising gate electrodes vertically stacked on the substrate;

a vertical channel portion provided on the cell region and vertically penetrating the stack;

a contact structure provided on the cell region dividing the stack into a plurality of parts spaced apart from each other in a horizontal direction;

a first contact provided on the contact region and connected to an end portion of a corresponding one of the gate electrodes;

an insulating structure provided on the peripheral region; an impurity region formed in the peripheral region of the substrate; and a second contact penetrating the insulating structure, the second contact being connected to the impurity region, wherein a top surface of the second contact is positioned at a lower level than a top surface of the contact structure and a top surface of the first contact, wherein the top surface of the second contact is coplanar with a top surface of a first insulating layer, the first insulating layer being provided on a top surface of the vertical channel portion, wherein the top surface of the contact structure is coplanar with a top surface of a second insulating layer, the second insulating layer being provided on the first insulating layer, and wherein the top surface of the first contact is coplanar with a top surface of a third insulating layer, the third insulating layer being provided on the second insulating layer.

17. The device of claim 16, further comprising:

a conductive pad provided on the vertical channel portion, wherein a top surface of the conductive pad is positioned at a lower level than the top surface of the second contact.

18. The device of claim 16, further comprising:

a first contact plug provided on the first contact; and a second contact plug provided on the second contact, wherein a top surface of the first contact plug and a top surface of the second contact plug are positioned at substantially the same level.

19. The device of claim 16, wherein the second insulating layer is provided to expose the top surface of the contact structure and cover the top surface of the first contact.

20. The device of claim 16, further comprising:

a silicide layer provided in the impurity region and between the second contact and the substrate.

* * * * *